(12) United States Patent
Van Der Goes et al.

(10) Patent No.: US 8,749,410 B1
(45) Date of Patent: Jun. 10, 2014

(54) CALIBRATION OF INTERLEAVING ERRORS IN A MULTI-LANE ANALOG-TO-DIGITAL CONVERTER

(71) Applicant: Broadcom Corporation, Irvine, CA (US)

(72) Inventors: Frank Van Der Goes, The Hague (NL); Christopher Ward, Utrecht (NL); Klaas Bult, Bosch en Duin (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/720,691

(22) Filed: Dec. 19, 2012

(51) Int. Cl.
*H03M 1/06* (2006.01)

(52) U.S. Cl.
USPC .......................................... 341/118; 341/120

(58) Field of Classification Search
USPC .................................. 341/118, 120, 155, 159
See application file for complete search history.

(56) References Cited

U.S. PATENT DOCUMENTS

| | | | | |
|---|---|---|---|---|
| 4,736,189 A * | 4/1988 | Katsumata et al. | ........... | 341/120 |
| 6,081,215 A * | 6/2000 | Kost et al. | ...................... | 341/120 |
| 6,097,324 A * | 8/2000 | Myer et al. | ..................... | 341/118 |
| 6,803,873 B1 * | 10/2004 | Motomatsu | .................... | 341/161 |
| 7,675,441 B2 * | 3/2010 | Sheng et al. | .................. | 341/120 |
| 2007/0262895 A1 * | 11/2007 | Stein et al. | ..................... | 341/155 |
| 2010/0220778 A1 * | 9/2010 | Fuse et al. | ..................... | 375/226 |
| 2012/0075129 A1 * | 3/2012 | Kidambi | ....................... | 341/118 |

\* cited by examiner

*Primary Examiner* — Peguy Jean Pierre

(74) *Attorney, Agent, or Firm* — Sterne, Kessler, Goldstein & Fox P.L.L.C.

(57) ABSTRACT

A multi-lane analog-to-digital converter (ADC) is disclosed that is capable of compensating for one or more of its impairments such that its digital output accurately represents its analog input. The multi-lane ADC can compensate for unwanted phase offsets between multiple phases of a sampling clock used by the multi-lane ADC, unwanted bandwidth mismatches between lanes in the multi-lane ADC, and/or unwanted gain mismatches between the lanes in the multi-lane ADC to provide some examples.

20 Claims, 15 Drawing Sheets

CALIBRATION OF INTERLEAVING ERRORS IN A MULTI-LANE ANALOG-TO-DIGITAL CONVERTER

BACKGROUND

1. Field of Disclosure

The present disclosure relates generally to a multi-lane analog-to-digital converter (ADC) and specifically to compensation of impairments present within the multi-lane ADC.

2. Related Art

Data converters are frequently used in mixed-signal electronic systems. Mixed signal electronic systems include both an analog signal environment and a digital signal environment. The analog signal environment primarily operates upon an analog input while the digital signal environment primarily operates upon a digital input. Commonly, an analog-to-digital converter (ADC) is used to convert the analog input from the analog signal environment to the digital input for the digital signal environment.

A multi-lane ADC includes multiple parallel lanes, or simply lanes, that sample the analog input utilizing multiple phases of a sampling clock and converts these samples from the analog signal domain to the digital signal domain. The multi-lane ADC interleaves these digital samples to provide the digital input for the digital signal environment. However, impairments within the multi-lane ADC can cause the digital input for the digital signal environment to no longer accurately represent the analog input. These impairments can include unwanted phase offsets between the multiple phases of the sampling clock, unwanted bandwidth mismatches between lanes in the multi-lane ADC, and/or unwanted gain mismatches between the lanes in the multi-lane ADC to provide some examples.

BRIEF DESCRIPTION OF THE DRAWINGS/FIGURES

The present disclosure is described with reference to the accompanying drawings. In the drawings, like reference numbers indicate identical or functionally similar elements. Additionally, the left most digit(s) of a reference number identifies the drawing in which the reference number first appears.

FIG. 1 illustrates a block diagram of a conventional multi-lane analog-to-digital converter (ADC);

FIG. 2A graphically illustrates multiple ideal phases of a sampling clock that are ideally used in the conventional multi-lane ADC;

FIG. 2B graphically illustrates unknown offsets between multiple phases of the sampling clock used in the conventional multi-lane ADC;

Figure 11:
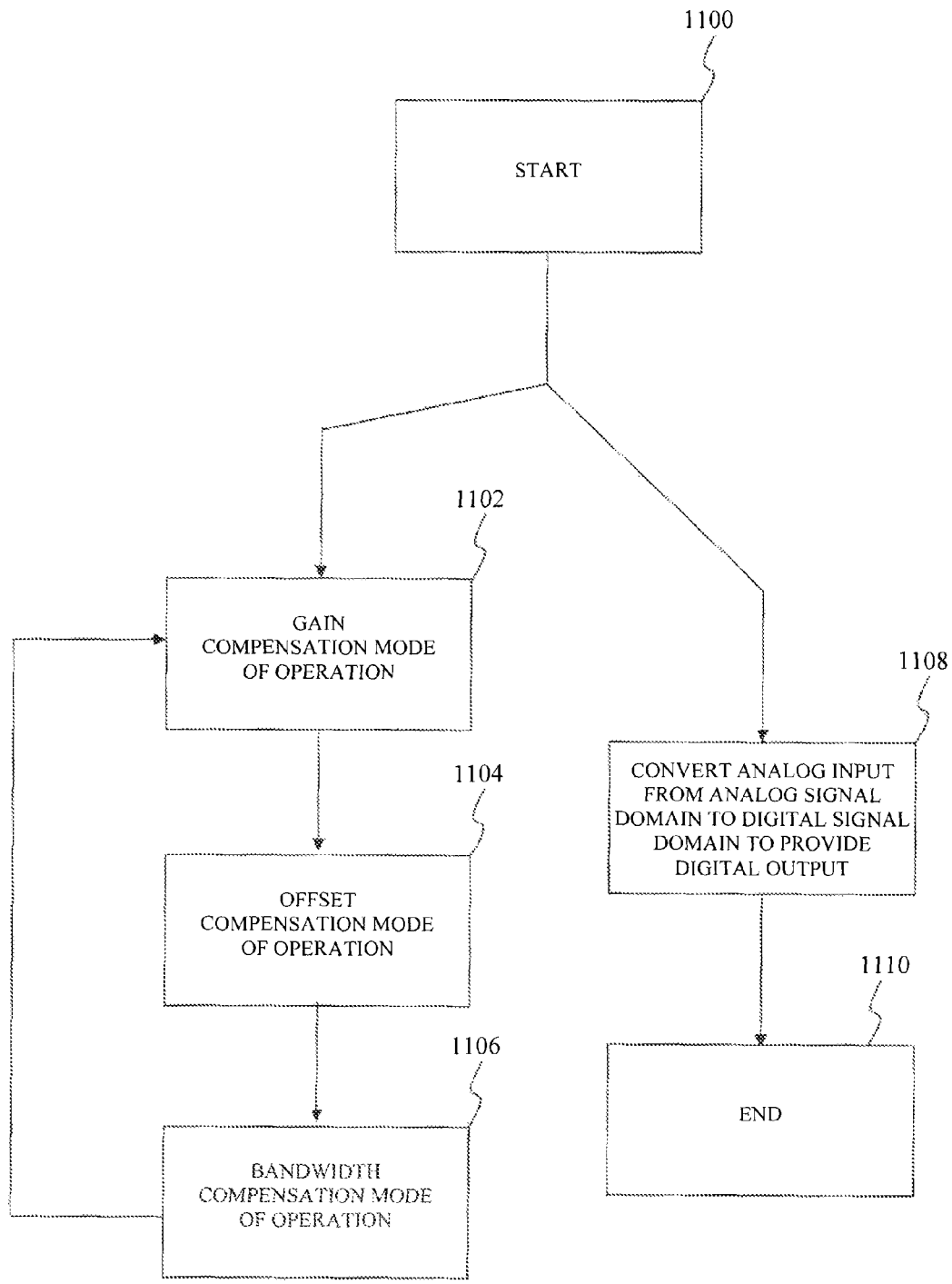
Figure 12:
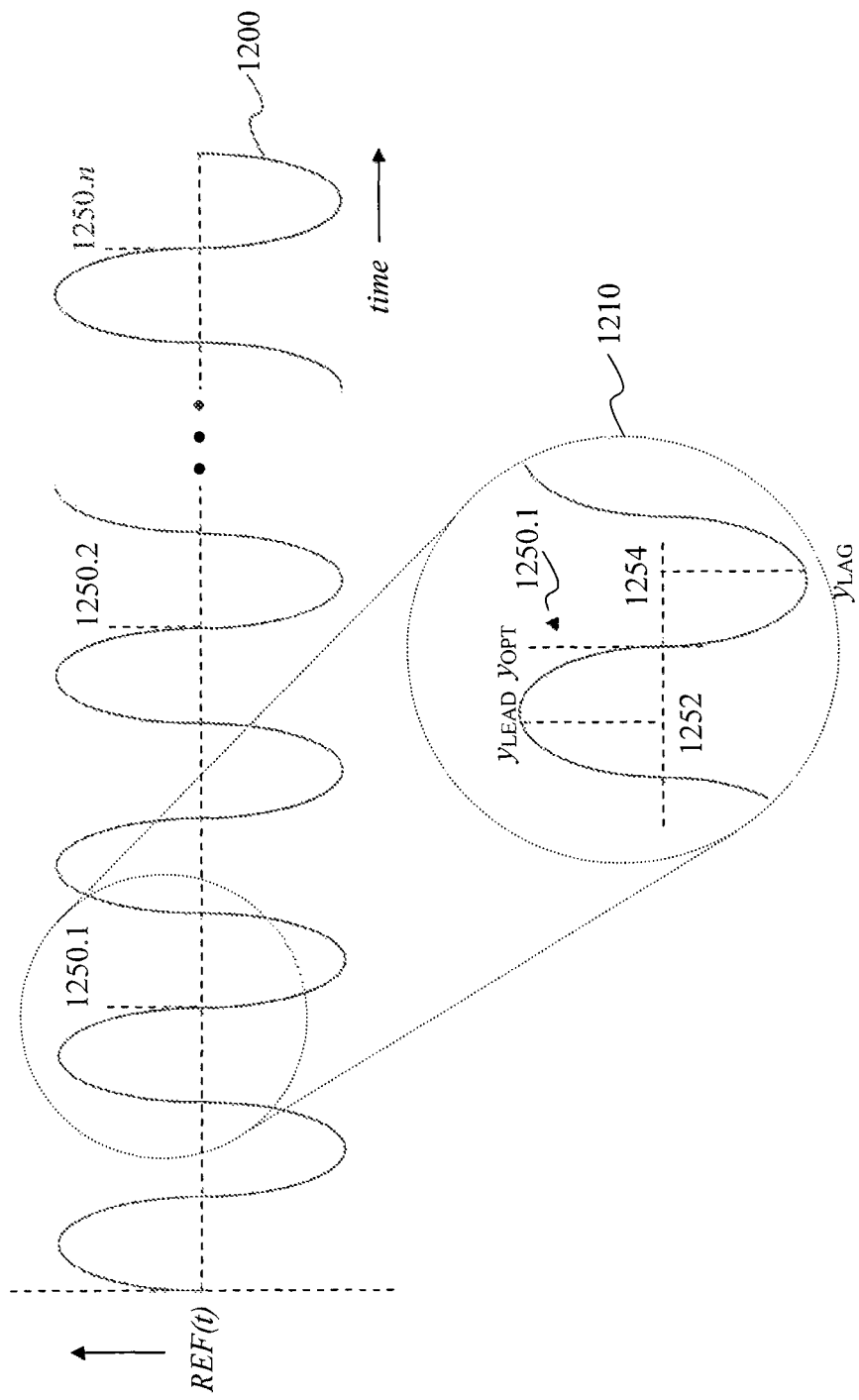

FIG. 11 is a flowchart of exemplary operational steps of the first exemplary multi-lane ADC or the second exemplary multi-lane ADC according to an exemplary embodiment of the present disclosure; and FIG. 12 illustrates a time-domain representation of an exemplary bandwidth compensation reference signal that can be used within the first exemplary multi-lane ADC according to an exemplary embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

A Conventional Multi-Lane Analog-to-Digital Converter (ADC)

Figure 1:
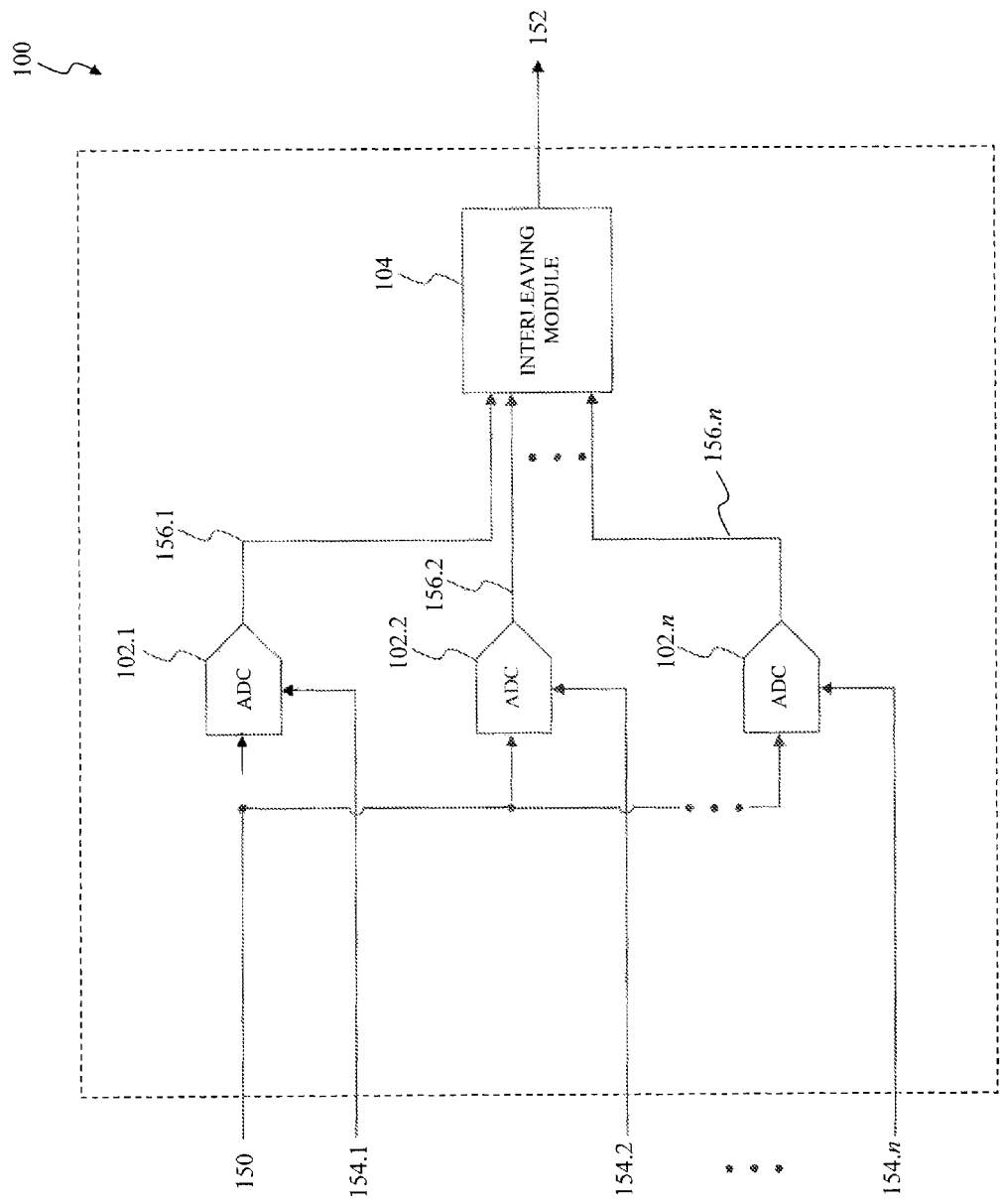

FIG. 1 illustrates a block diagram of a conventional multi-lane analog-to-digital converter (ADC). A conventional multi-lane ADC 100 converts an analog input 150 from an analog signal domain to a digital signal domain to provide a digital output 152. The conventional multi-lane ADC 100 utilizes multiple phases of a sampling clock to sample the analog input 150, converts these samples from the analog signal domain to the digital signal domain, and interleaves these digital samples to provide the digital output 152. However, impairments within the conventional multi-lane ADC 100 can cause the digital output 152 to no longer accurately represent the analog input 150. These impairments can include unwanted phase offsets between the multiple phases of the sampling clock, unwanted bandwidth mismatches between lanes in the conventional multi-lane ADC 100, and/or unwanted gain mismatches between the lanes in the conventional multi-lane ADC 100 to provide some examples. The conventional multi-lane ADC 100 includes ADCs 102.1 through 102.n and an interleaving module 104.

The ADCs 102.1 through 102.n sample the analog input 150 in accordance with multiple phases 154.1 through 154.n of a sampling clock and convert these samples from the analog signal domain to the digital signal domain to provide digital samples 156.1 through 156.n. The ADCs 102.1 through 102.n collectively sample the analog input 150, staggered in time, each at a slower rate than the Nyquist frequency of the analog input 150, but collectively at a rate equal or surpassing the Nyquist frequency. However, impairments within the ADCs 102.1 through 102.n can cause the digital samples 156.1 through 156.n, when recombined as to be discussed below, to no longer accurately represent the analog input 150.

Figure 2A:
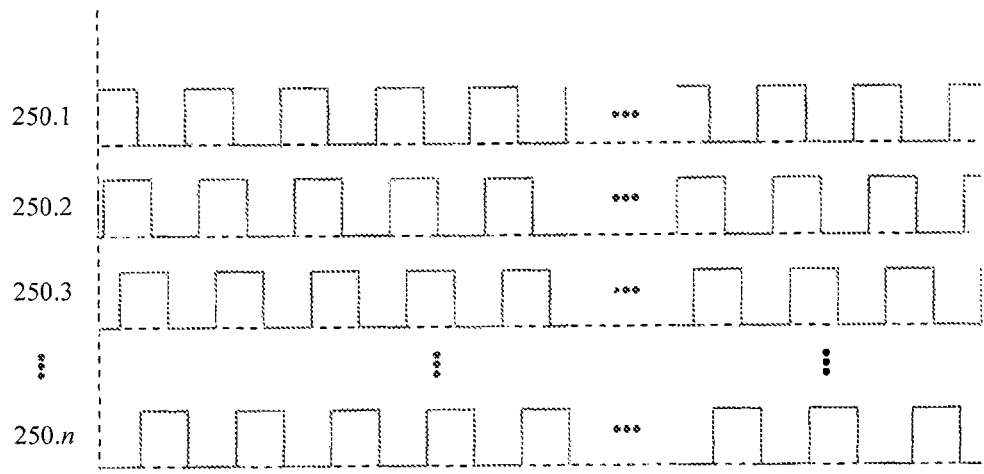

FIG. 2A graphically illustrates multiple ideal phases of a sampling clock that are ideally used in the conventional multi-lane. ADC. As shown in FIG. 2A, multiple ideal phases 250.1 through 250.n of the sampling clock are characterized as having a substantially similar frequency, but are offset in phase from each other. The multiple ideal phases 250.1 through 250.n of the sampling clock represent ideal phases of the sampling clock that may be used by the ADCs 102.1 through 102.n to sample the analog input 150 at ideal sampling points such that the digital samples 156.1 through 156.n which, when recombined as to be discussed below, most accurately represent the analog input 150.

A frequency of each of the multiple phases 250.1 through 250.n of the sampling clock is given by:

$$\frac{f_s}{N}, \qquad (1)$$

where $f_s$ represents an overall, or combined, sampling frequency of the analog input 150 and N represents a number of the ADCs 102.1 through 102.n, often referred to as lanes, within the conventional multi-lane ADC 100. The phase offset between the multiple ideal phases 250.1 through 250.n of the sampling clock may be characterized as:

$$\frac{2\pi}{N}, \qquad (2)$$

where N represents the number of the ADCs 102.1 through 102.n within the conventional multi-lane ADC 100.

Figure 2B:
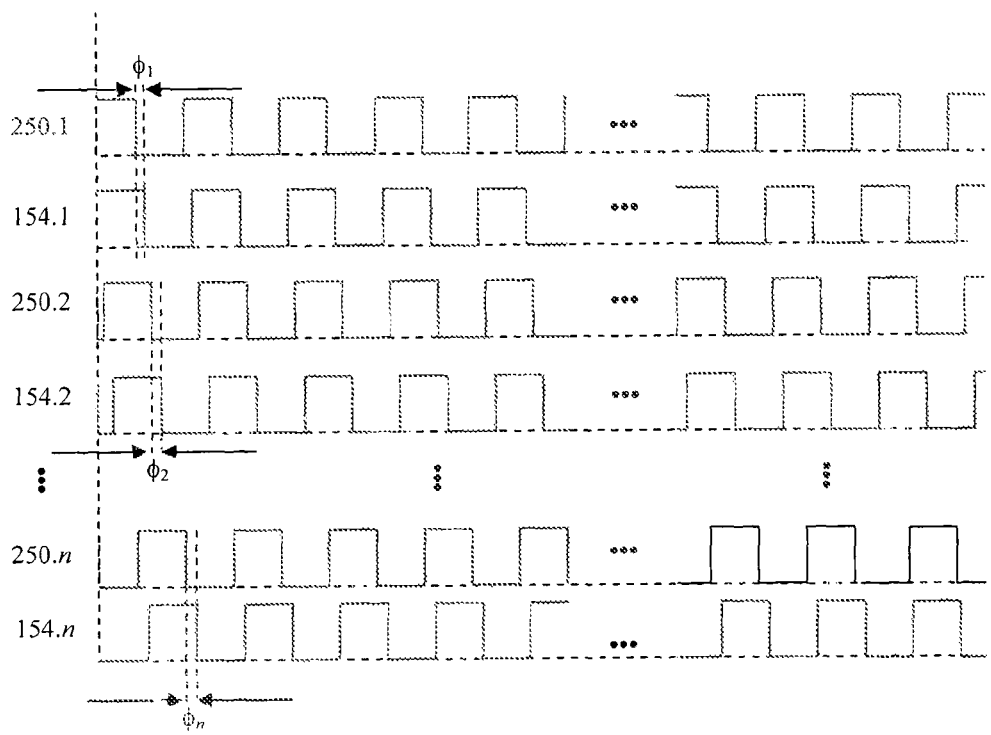

FIG. 2B graphically illustrates unknown offsets between multiple phases of the sampling clock used in the conventional multi-lane ADC. As shown in FIG. 2B, the multiple phases 154.1 through 154.n of the sampling clock are characterized as being offset from the multiple ideal phases 250.1 through 250.n of the sampling clock. Unwanted phase offsets $\phi_1$ through $\phi_n$ between the multiple ideal phases 250.1 through 250.n of the sampling clock and the multiple phases 154.1 through 154.n of the sampling clock may cause the ADCs 102.1 through 102.n to sample the analog input 150 at undesirable instances in time which may cause the digital samples 156.1 through 156.$n$, when recombined, to no longer accurately represent the analog input 150. For example, the unwanted phase offsets $\phi_1$ through $\phi_n$ may cause the ADCs 102.1 through 102.$n$ to sample the analog input 150 earlier and/or later then intended. Additionally, other impairments, such as unwanted bandwidth mismatches and/or unwanted gain mismatches between the ADCs 102.1 through 102.$n$ can also cause the digital samples 156.1 through 156.$n$, when recombined, to no longer accurately represent the analog input 150.

Even though the unwanted phase offsets $\phi_1$ through $\phi_n$ are shown to be substantially similar unwanted phase offsets, this is for illustrative purposes only. Those skilled in the relevant art(s) will recognize that the unwanted phase offsets $\phi_1$ through $\phi_n$ may be different unwanted phase offsets. For example, some of the unwanted phase offsets $\phi_1$ through $\phi_n$ may represent unwanted negative phase offsets whereby the multiple ideal phases 250.1 through 250.$n$ of the sampling clock lag the multiple phases 154.1 through 154.$n$ of the sampling clock or some of the unwanted phase offsets $\phi_1$ through $\phi_n$ may represent unwanted positive phase offsets whereby the multiple ideal phases 250.1 through 250.$n$ of the sampling clock lead the multiple phases 154.1 through 154.$n$ of the sampling clock, and/or any combination thereof.

Referring back to FIG. 1, the interleaving module 104 interleaves or re-combines the digital samples 156.1 through 156.$n$ to provide the digital output 152. Specifically, the interleaving module 104 recombines the digital samples 156.1 through 156.$n$ in a continuous, or near-continuous, manner to provide the digital output 152. However, impairments, such as unwanted phase offsets between the multiple phases 154.1 through 154.$n$ of the sampling clock, unwanted bandwidth mismatches between the ADCs 102.1 through 102.$n$, and/or unwanted gain mismatches between the ADCs 102.1 through 102.$n$ can cause the digital samples 156.1 through 156.$n$ to no longer accurately represent the analog input 150.

Overview

The following Detailed Description describes a multi-lane ADC that is capable of compensating for one or more of its impairments such that its digital output more accurately represents its analog input when compared to the conventional multi-lane ADC 100. The multi-lane ADC can compensate for unwanted phase offsets between multiple phases of a sampling clock used by the multi-lane ADC, unwanted bandwidth mismatches between lanes in the multi-lane ADC, and/or unwanted gain mismatches between the lanes in the multi-lane ADC to provide some examples. For example, the multi-lane ADC can estimate the phase offsets between the multiple phases of the sampling clock and can adjust the multiple phases of the sampling clock accordingly to compensate for these unwanted phase offsets. As another example, the multi-lane ADC can estimate the unwanted gain mismatches between the lanes in the multi-lane ADC and adjust digital samples provided by the multi-lane ADC accordingly to compensate for these unwanted gain mismatches. As a further example, the multi-lane ADC can estimate the unwanted bandwidth mismatches between the lanes in the multi-lane ADC and adjust bandwidths of the lanes accordingly to compensate for these unwanted bandwidth mismatches.

First Exemplary Multi-Lane ADC

Figure 3:
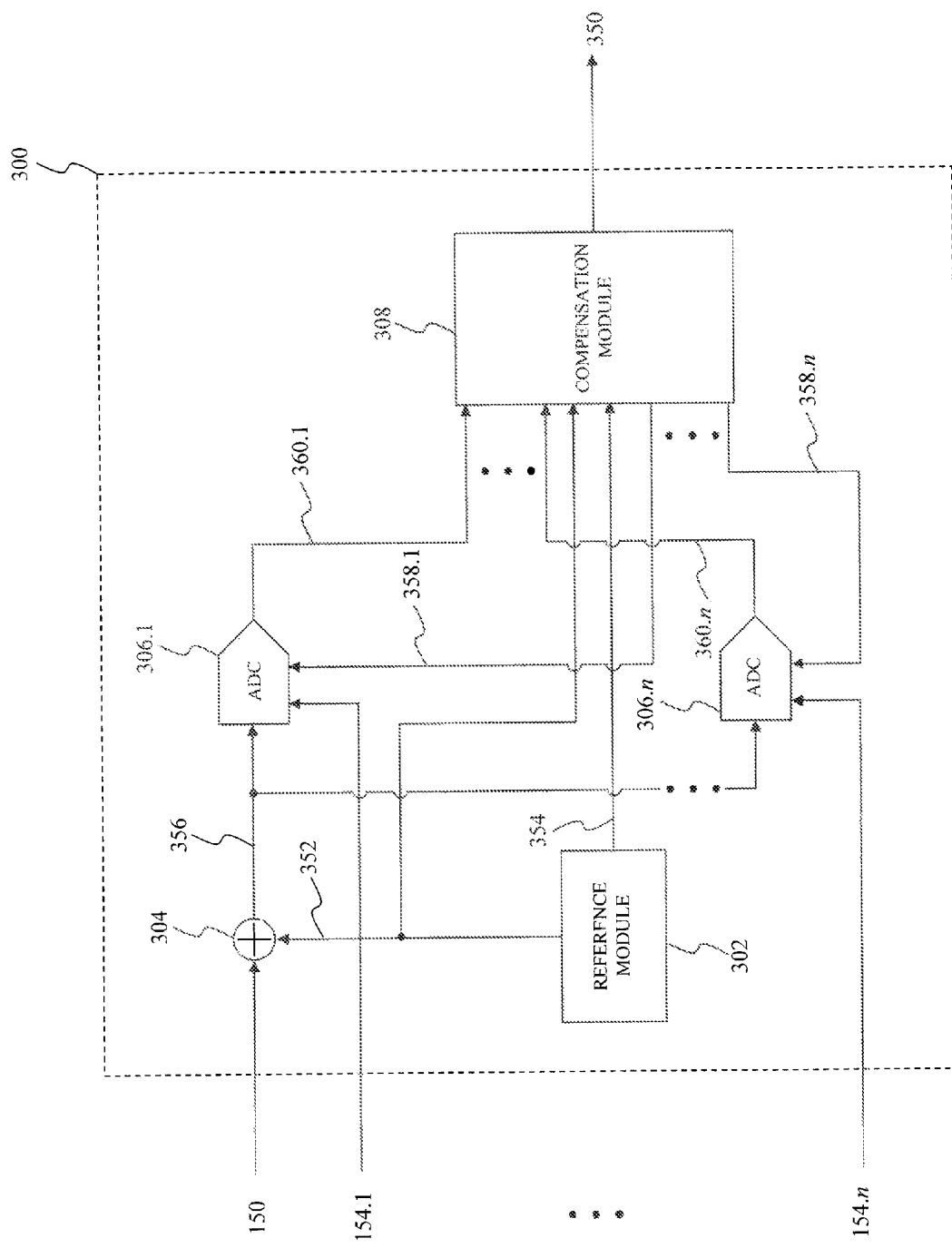
FIG. 3 illustrates a block diagram of a first exemplary multi-lane ADC according to an exemplary embodiment of the present disclosure.

FIG. 3 illustrates a block diagram of a first exemplary multi-lane ADC according to an exemplary embodiment of the present disclosure. A multi-lane ADC 300 converts the analog input 150 from the analog signal domain to the digital signal domain to provide a digital output 350. The multi-lane ADC 300 utilizes the multiple phases of the sampling clock to sample the analog input 150, converts these samples from the analog signal domain to the digital signal domain, and interleaves these digital samples to provide the digital output 350. The multi-lane ADC 300 can operate in a phase offset compensation mode of operation to compensate for unwanted phase offsets between the multiple phases of the sampling clock by adjusting phases of the multiple phases of the sampling clock. Alternatively, or in addition to, the multi-lane ADC 300 can operate in a gain compensation mode of operation to compensate for unwanted gain mismatches between the lanes in the multi-lane ADC 300 by adjusting amplitudes of the digital samples. As another alternate, or in addition to, the multi-lane ADC 300 can operate in a bandwidth compensation mode of operation to compensate for unwanted bandwidth mismatches between the lanes in the multi-lane ADC 300 by adjusting bandwidths of the lanes in the multi-lane ADC 300. As a result of the phase offset, the gain compensation, and the bandwidth compensation modes of operation, the digital output 350 more accurately represents the analog input 150 when compared to the digital output 152 of the conventional multi-lane ADC 100. The multi-lane ADC 300 includes a reference module 302, a summation module 304, ADC modules 306.1 through 306.$n$, and a compensation module 308.

The reference module 302 provides an uncorrelated reference signal 352 that is substantially uncorrelated with the analog input 150. Generally, the reference module 302 generates a pseudo-random correlation signal 354, such as a pseudo-random binary sequence to provide an example, which is to be provided to the compensation module 308 as to be discussed below. The pseudo-random correlation signal 354 ensures that a phase offset compensation reference signal, a gain compensation reference signal, and/or a bandwidth compensation reference signal are substantially uncorrelated with the analog input 150. This allows the compensation module 308 to perform a background calibration of the multi-lane ADC 300 by substantially concurrently estimating the unwanted phase offsets, the unwanted gain mismatches, and/or the unwanted bandwidth mismatches while the multi-lane ADC 300 is converting the analog input 150 from the analog signal domain to the digital signal domain. The reference module 302 mixes or multiplies the phase offset compensation reference signal in the phase offset compensation mode of operation, the gain compensation reference signal in the gain compensation mode of operation, and/or the bandwidth compensation reference signal in the bandwidth compensation mode of operation with the pseudo-random correlation signal 354 to provide the uncorrelated reference signal 352.

The summation module 304 combines the analog input 150 and the uncorrelated reference signal 352 to superimpose the uncorrelated reference signal 352 onto the analog input 150 to provide a reference superimposed analog input 356.

The ADC modules 306.1 through 306.$n$ sample the reference superimposed analog input 356 in accordance with the multiple phases 154.1 through 154.$n$ of the sampling clock. The ADC modules 306.1 through 306.$n$ can adjust phases of the multiple phases 154.1 through 154.$n$ of the sampling clock in response to phase and/or bandwidth adjustment signals 358.1 through 358.$n$ to compensate for the unwanted phase offsets between the multiple phases 154.1 through 154.$n$ of the sampling clock and/or for the unwanted bandwidth mismatches between the lanes in the multi-lane ADC 300. For example, each of the ADC modules 306.1 through 306.$n$ can advance and/or retreat a phase of its respective multiple phase 154.1 through 154.$n$ of the sampling clock in response to its respective phase and/or bandwidth adjustment signal 358.1 through 358.$n$. As another example, or in addition to, each of the ADC modules 306.1 through 306.*n* can adjust its respective frequency response, or bandwidth, in response to its respective phase and/or bandwidth adjustment signal 358.1 through 358.*n*. The phase and/or bandwidth adjustment signals 358.1 through 358.*n* can include phase adjustment components for adjusting phases of the multiple phases 154.1 through 154.*n* of the sampling clock and/or bandwidth adjustment components for adjusting frequency responses, or bandwidths, of the ADC modules 306.1 through 306.*n*. The phase adjustment components and the bandwidth adjustment components can represent separate signals or can be multiplexed into combined signals. The ADC modules 306.1 through 306.*n* convert these samples from the analog signal domain to the digital signal domain to provide the reference superimposed digital samples 360.1 through 360.*n*.

As discussed above, the analog input 150 is substantially uncorrelated with the uncorrelated reference signal 352; therefore, the compensation module 308 can estimate impairments, such as unwanted phase offsets, unwanted bandwidth mismatches, and/or unwanted gain mismatches between the lanes in the multi-lane ADC to provide some examples, within the multi-lane ADC 300 utilizing a digital representation of the uncorrelated reference signal 352 that is embedded within the reference superimposed digital samples 360.1 through 360.*n*. The compensation module 308 can provide various analog and/or digital adjustment signals, such as phase, frequency, and/or gain adjustment signals to provide some examples, to adjust one or more operational parameters of the multi-lane ADC 300 to compensate for the impairments. The compensation module 308 can remove the digital representation of the uncorrelated reference signal 352 from the reference superimposed digital samples 360.1 through 360.*n* to provide the digital output 350.

The compensation module 308 estimates the unwanted phase offsets to provide the phase and/or bandwidth adjustment signals 358.1 through 358.*n* in the phase offset compensation mode of operation. Specifically, the compensation module 308 separates the digital representation of the uncorrelated reference signal 352 from each of the reference superimposed digital samples 360.1 through 360.*n*. The compensation module compares each of the digital representations of the uncorrelated reference signal 352 to estimate the unwanted phase offsets between the ADC modules 306.1 through 306.*n*. Each of the digital representations of the uncorrelated reference signal 352 assumes different digital values depending upon the whether the multiple phases 154.1 through 154.*n* of the sampling clock lead, lag, or coincide with sampling moments of their respective ADC modules 306.1 through 306.*n*. In an exemplary embodiment, the sampling moments of the ADC modules 306.1 through 306.*n* coincide with the overall sampling rate of the multi-lane ADC 300, namely, of the ADC modules 306.1 through 306.*n* sample their respectively inputs on a substantially equidistant grid. The compensation module 308 provides the phase and/or bandwidth adjustment signals 358.1 through 358.*n* which cause the ADC modules 306.1 through 306.*n* to advance and/or retreat the phase of their respective multiple phases 154.1 through 154.*n* of the sampling clock to compensate for the unwanted phase offsets.

Additionally, the compensation module 308 estimates the unwanted gain mismatches between the ADC modules 306.1 through 306.*n* and adjusts gains of one or more ADC modules 306.1 through 306.*n* in the gain compensation mode of operation. The compensation module 308 determines one or more gains of the ADC modules 306.1 through 306.*n* in a substantially similar manner as the unwanted phase offsets. The compensation module 308 adjusts the reference superimposed digital samples 360.1 through 360.*n* to cause the gains of one or more ADC modules 306.1 through 306.*n* to be substantially similar indicating no substantial unwanted gain mismatches between the one or more ADC modules 306.1 through 306.*n*. For example, amplitudes of the reference superimposed digital samples 360.1 through 360.*n* can be substantially different indicating unwanted gain mismatches between one or more ADC modules 306.1 through 306.*n*. In this example, the compensation module 308 adjusts, by increasing and/or decreasing, the amplitudes of the reference superimposed digital samples 360.1 through 360.*n* to approach substantial similarity.

Further, the compensation module 308 estimates the unwanted bandwidth mismatches to provide the phase and/or bandwidth adjustment signals 358.1 through 358.*n* in the bandwidth compensation mode of operation. Specifically, the compensation module 308 separates the digital representation of the uncorrelated reference signal 352 from each of the reference superimposed digital samples 360.1 through 360.*n*. The compensation module compares each of the digital representations of the uncorrelated reference signal 352 to estimate the unwanted bandwidth mismatches between the ADC modules 306.1 through 306.*n*. Each of the digital representations of the uncorrelated reference signal 352 assumes different digital values depending upon a frequency response, or bandwidth, of their respective ADC modules 306.1 through 306.*n*. The compensation module 308 provides the phase and/or bandwidth adjustment signals 358.1 through 358.*n* which cause the ADC modules 306.1 through 306.*n* to adjust their frequency responses, or bandwidths to compensate for the unwanted bandwidth mismatches.

Yet further, the compensation module 308 can interleave or re-combine the reference superimposed digital samples 360.1 through 360.*n* to provide a reference superimposed digital output. The compensation module 308 can remove a digital representation of the uncorrelated reference signal 352 from the reference superimposed digital output to provide the digital output 350.

Figure 4:
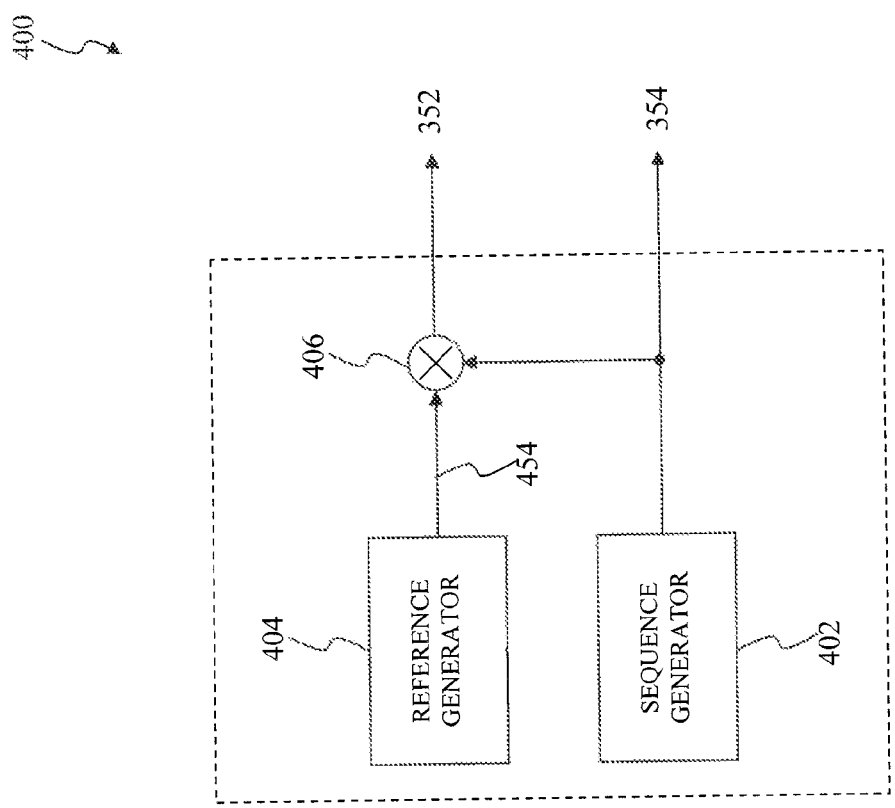
FIG. 4 illustrates a block diagram of a reference module that can be implemented within the first exemplary multi-lane ADC according to an exemplary embodiment of the present disclosure.

Exemplary Reference Module that can be Implemented within in the First Exemplary Multi-Lane ADC FIG. 4 illustrates a block diagram of a reference module that can be implemented within the first exemplary multi-lane ADC according to an exemplary embodiment of the present disclosure. A reference module 400 provides an uncorrelated reference signal 352 that is substantially uncorrelated with an analog input. Generally, the reference module 400 mixes or multiples a phase offset compensation reference signal in the phase offset compensation mode of operation, a gain compensation reference signal in the gain compensation mode of operation, or a bandwidth compensation reference signal with a pseudo-random correlation signal 354. The reference module 400 includes a sequence generator 402 and a reference generator 404. The reference module 400 can represent an exemplary embodiment of the reference module 302.

The reference generator 404 provides a reference signal 454 that is substantially uncorrelated with the analog input. The reference signal 454 can represent the phase offset compensation reference signal in the phase offset compensation mode of operation. The phase offset compensation reference signal is characterized as being periodic with a sampling clock of a multi-lane ADC, such as the multi-lane ADC 300 to provide an example, and non-substantially constant amplitude around sampling moments of the ADC modules of the multi-lane ADC, such as the ADC modules 306.1 through 306.*n*. The sampling moments of the ADC modules represent instances in time where the ADC modules sample their respective inputs. The reference signal 454 can alternatively, or in addition to, represent the gain compensation reference signal in the gain compensation mode of operation. The gain offset compensation reference signal is characterized as being periodic with the sampling clock and substantially constant amplitude around the sampling moments of the ADC modules 306.1 through 306.n. The reference signal 454 can also alternatively, or in addition to, represent the bandwidth compensation reference signal in the bandwidth compensation mode of operation. The bandwidth compensation reference signal is characterized as being a sinusoidal signal with a substantially constant frequency, or can vary in frequency.

The sequence generator 402 provides the pseudo-random correlation signal 354. In an exemplary embodiment, the pseudo-random correlation signal 354 represents a pseudo-random digital sequence of binary numbers that include various pseudo-random combinations of logical zeros and/or logical ones. The pseudo-random nature of the pseudo-random correlation signal 354 ensures that the uncorrelated reference signal 352 is uncorrelated, or minimally correlated, with the analog input.

The analog multiplier 406 multiplies the pseudo-random correlation signal 354 and the reference signal 454 in the analog signal domain to provide the uncorrelated reference signal 352.

Exemplary Phase Offset Compensation Reference Signals

Figure 5A:
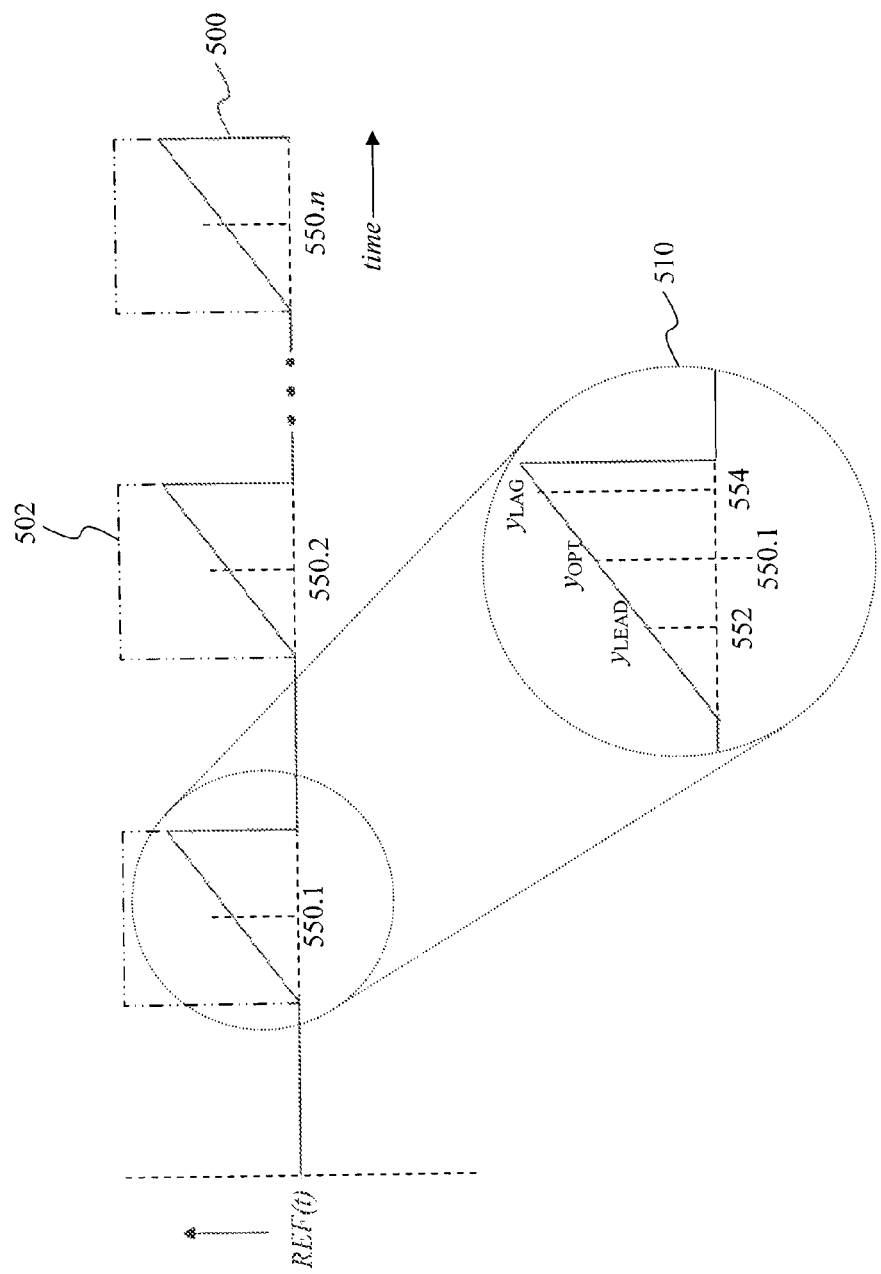
FIG. 5A illustrates a time-domain representation of a first exemplary phase offset compensation reference signal that can be used within the first exemplary multi-lane ADC according to an exemplary embodiment of the present disclosure.

FIG. 5A illustrates a time-domain representation of a first exemplary phase offset compensation reference signal that can be used within the first exemplary multi-lane ADC according to an exemplary embodiment of the present disclosure. A multi-lane ADC can utilize a phase offset compensation reference signal 500 to estimate unwanted phase offsets between multiple phases of a sampling clock 502 of the multi-lane ADC. The phase offset compensation reference signal 500 can represent an exemplary embodiment of the reference signal 454.

As shown in FIG. 5A, the phase offset compensation reference signal 500 can be characterized as being a periodic ramping signal that is periodic with the sampling clock 502. However, this is for illustrative purposes only, those skilled in the relevant art(s) will recognize that the phase offset compensation reference signal 500 can be implemented using any other non-linear function or any linear increasing function that is non-substantially constant amplitude around sampling moments of ADC modules, such as the ADC modules 306.1 through 306.n, of the multi-lane ADC without departing from the spirit and scope of the present disclosure.

In the phase offset compensation mode of operation, the phase offset compensation reference signal 500 can also be characterized as increasing in amplitude around sampling moments 550.1 through 550.n of ADC modules of the multi-lane ADC, such as the ADC modules 306.1 through 306.n to provide an example. For example, as shown in an exploded view 510, the phase offset compensation reference signal 500 assumes a first digital representation $y_{LAG}$, when a first ADC module from among the ADC modules samples its corresponding input at a leading sampling moment 552 that lags the sampling moment 550.1 in time. As another example, the phase offset compensation reference signal 500 assumes a second digital representation $y_{OPT}$, which is greater than the first digital representation $y_{LEAD}$, when the first ADC module samples its corresponding input at the sampling moment 550.1. As a further example, the phase offset compensation reference signal 500 assumes a third digital representation, $y_{LEAD}$, which is greater than the second digital representation $y_{LAG}$, when the first ADC module samples its corresponding input at a lagging sampling moment 554 that leads the sampling moment 550.1 in time.

Figure 5B:
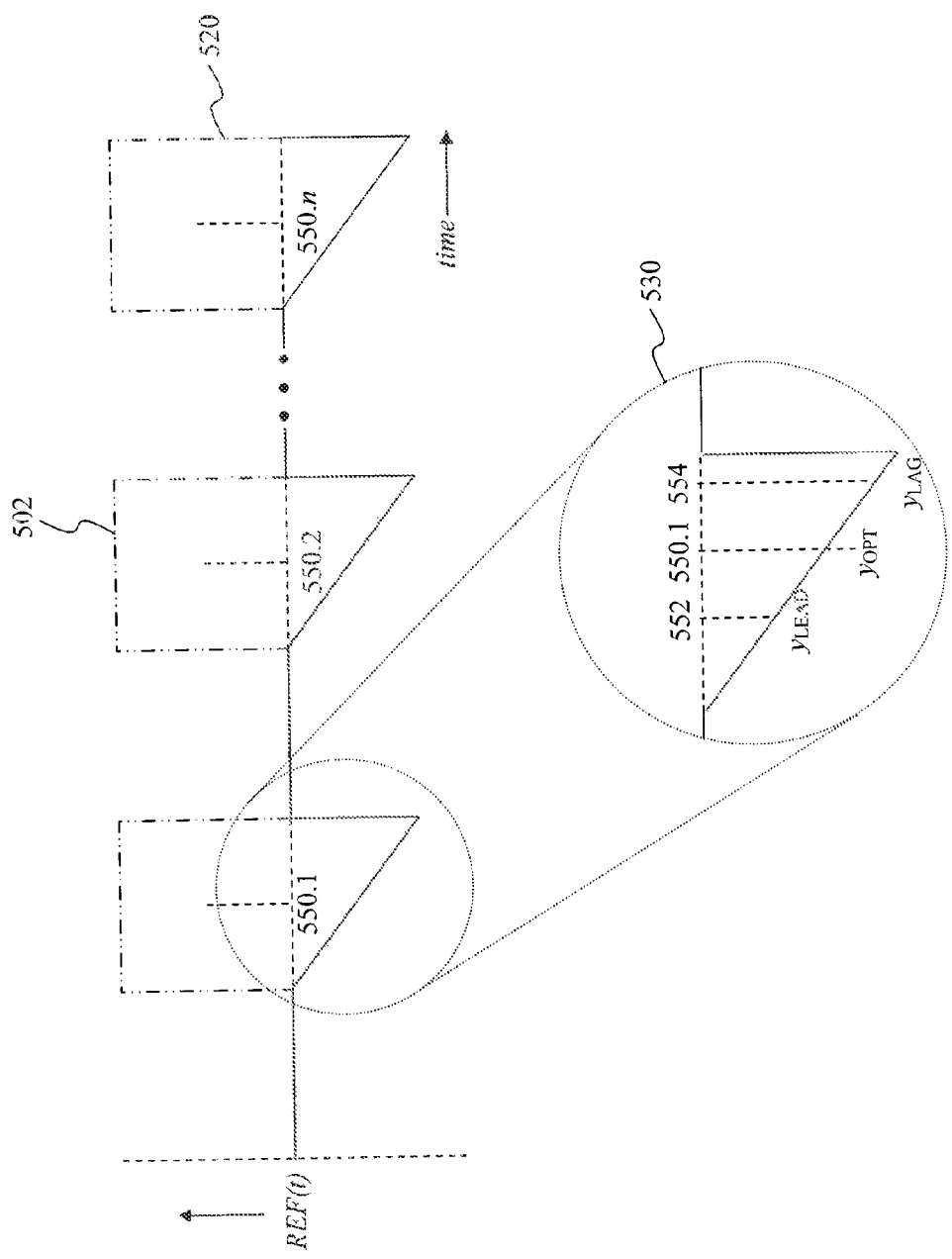
FIG. 5B illustrates a time-domain representation of a second exemplary phase offset compensation reference signal that can be used within the first exemplary multi-lane ADC according to an exemplary embodiment of the present disclosure.

FIG. 5B illustrates a time-domain representation of a second exemplary phase offset compensation reference signal that can be used within the first exemplary multi-lane ADC according to an exemplary embodiment of the present disclosure. A multi-lane ADC can utilize a phase offset compensation reference signal 520 in a substantially similar manner as the phase offset compensation reference signal 500 to estimate the unwanted phase offsets between the multiple phases of the sampling clock. Therefore, only differences between the phase offset compensation reference signal 500 and the phase offset compensation reference signal 520 are to be discussed in further detail below.

As shown in FIG. 5B, the phase offset compensation reference signal 520 can also be characterized as decreasing in amplitude around the sampling moments 550.1 through 550.n of the ADC modules. For example, as shown in an exploded view 530, the phase offset compensation reference signal 520 assumes the first digital representation $y_{LEAD}$, when the first ADC module samples its corresponding input at the leading sampling moment 552. As another example, the phase offset compensation reference signal 520 assumes the second digital representation $y_{OPT}$, which is less than the first digital representation $y_{LEAD}$, when the first ADC module samples its corresponding input at the sampling moment 550.1. As a further example, the phase offset compensation reference signal 520 assumes the third digital representation, $y_{LAG}$, which is less than the second digital representation $y_{OPT}$, when the first ADC module samples its corresponding input at the lagging sampling moment 554.

Exemplary Gain Compensation Reference Signal

Figure 6:
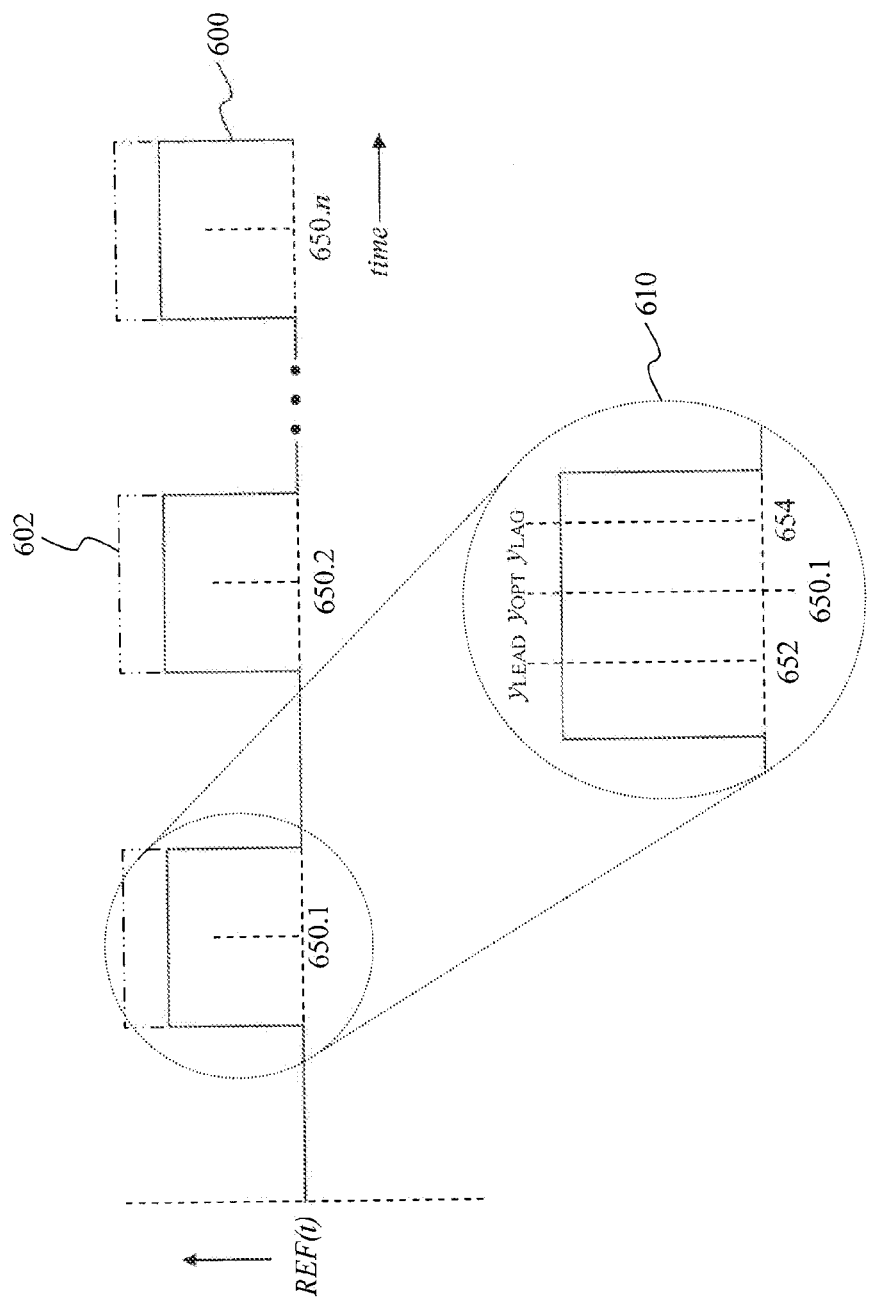
FIG. 6 illustrates a time-domain representation of an exemplary gain compensation reference signal that can be used within the first exemplary multi-lane ADC according to an exemplary embodiment of the present disclosure.

FIG. 6 illustrates a time-domain representation of an exemplary gain compensation reference signal that can be used within the first exemplary multi-lane ADC according to an exemplary embodiment of the present disclosure. A multi-lane ADC can utilize a gain compensation reference signal 600 to estimate unwanted gain mismatches between ADC modules of the multi-lane ADC. The gain compensation reference signal 600 can represent an exemplary embodiment of the reference signal 454.

As shown in FIG. 6, the gain compensation reference signal 600 can be characterized as being a periodic pulse signal that is periodic with the sampling clock 602. However, this is for illustrative purposes only, those skilled in the relevant art(s) will recognize that the gain compensation reference signal 600 can be implemented using any other non-linear or any linear increasing function having substantially constant amplitude around sampling moments of the ADC modules of the multi-lane ADC without departing from the spirit and scope of the present disclosure.

In the gain compensation mode of operation, the gain compensation reference signal 600 can also be characterized as having substantially constant amplitude around sampling moments 650.1 through 650.n of the ADC modules of the multi-lane ADC. For example, as shown in an exploded view 610, the gain compensation reference signal 600 assumes a first digital representation $y_{LEAD}$, when a first ADC module from among the ADC modules samples its corresponding input at a leading sampling moment 652 that leads the sampling moment 650.1 in time. As another example, the gain compensation reference signal 600 assumes a second digital representation $y_{OPT}$, which is substantially equal to the first digital representation $y_{LEAD}$, when the first ADC module samples its corresponding input at the sampling moment 650.1. As a further example, the gain compensation reference signal 600 assumes a third digital representation, $y_{LAG}$, which is substantially equal to the second digital representation $y_{OPT}$, when the first ADC module samples its corresponding input at a lagging sampling moment 654 that leads the sampling moment 650.1 in time.

Exemplary Bandwidth Compensation Reference Signal

FIG. 12 illustrates a time-domain representation of an exemplary bandwidth compensation reference signal that can be used within the first exemplary multi-lane ADC according to an exemplary embodiment of the present disclosure. A multi-lane ADC can utilize a bandwidth compensation reference signal 1200 to estimate unwanted bandwidth mismatches between ADC modules of the multi-lane ADC. The bandwidth compensation reference signal 1200 can represent an exemplary embodiment of the reference signal 454.

As shown in FIG. 12, the bandwidth compensation reference signal 1200 can be characterized as being a sinusoidal signal having a substantially constant frequency. However, this is for illustrative purposes only, those skilled in the relevant art(s) will recognize that the bandwidth compensation reference signal 1200 can be implemented using other sinusoidal signals having different frequencies than as illustrated in FIG. 12 without departing from the spirit and scope of the present disclosure. Additionally, although not illustrated in FIG. 12, the bandwidth compensation reference signal 1200 can be at first substantially constant frequency for a first duration in time and be adjusted in frequency to second substantially constant frequency, that is greater than or less than the first substantially constant frequency, for a second duration in time.

In the bandwidth compensation mode of operation, the bandwidth compensation reference signal 1200 can also be characterized as varying in amplitude around sampling moments 1250.1 through 1250.n of the ADC modules of the multi-lane ADC. For example, as shown in an exploded view 1210, the bandwidth compensation reference signal 1200 assumes a first digital representation $y_{LAG}$, when a first ADC module from among the ADC modules samples its corresponding input at a leading sampling moment 1252 that lags the sampling moment 1250.1 in time. As another example, the bandwidth compensation reference signal 1200 assumes a second digital representation $y_{OPT}$, which is greater than the first digital representation $y_{LEAD}$, when the first ADC module samples its corresponding input at the sampling moment 1250.1. As a further example, the bandwidth compensation reference signal 1200 assumes a third digital representation, $y_{LEAD}$, which is greater than the second digital representation $y_{LAG}$, when the first ADC module samples its corresponding input at a lagging sampling moment 1254 that leads the sampling moment 1250.1 in time. Although the sampling moment 1250.1 is illustrated as being at a zero crossing of the bandwidth compensation reference signal 1200, this is for illustrative purposes only. Those skilled in the relevant art(s) will recognize that the sampling moments 1250.1 through 1250.n can occur anywhere within the bandwidth compensation reference signal 1200 without departing from the spirit and scope of the present disclosure.

Figure 7A:
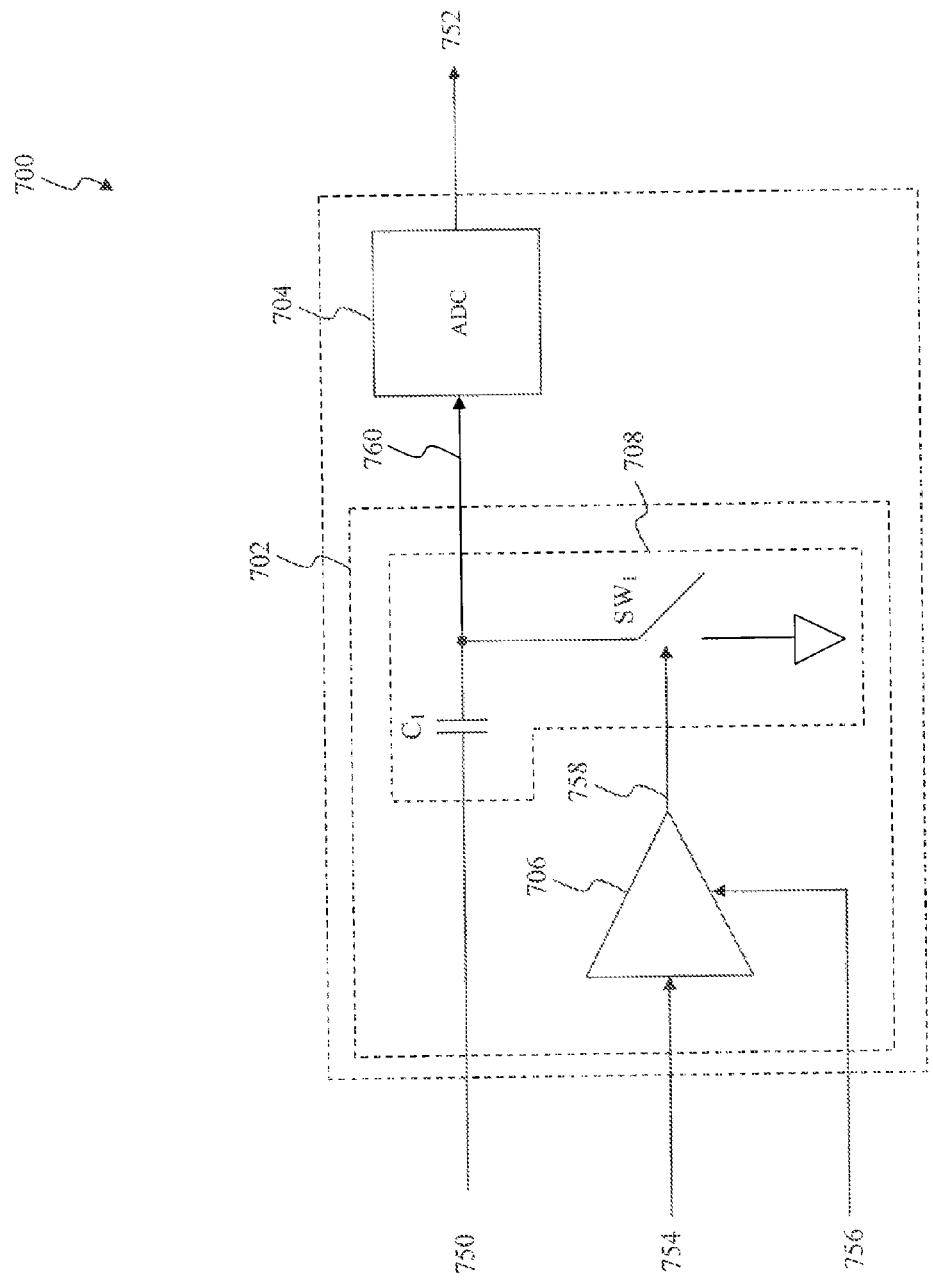
FIG. 7A illustrates a block diagram of a first ADC module that can be implemented within the first exemplary multi-lane ADC according to an exemplary embodiment of the present disclosure.

Exemplary ADC Modules that can be Implemented within in the First Exemplary Multi-Lane ADC FIG. 7A illustrates a block diagram of a first ADC module that can be implemented within the first exemplary multi-lane ADC according to an exemplary embodiment of the present disclosure. An ADC module 700 converts an analog input 750 from the analog signal domain to the digital signal domain to provide a digital sample 752. The ADC module 700 samples the analog input 750, and converts these samples from the analog signal domain to the digital signal domain to provide the digital sample 752. The ADC module 700 includes a sampling module 702 and an ADC 704. The ADC module 700 can represent an exemplary embodiment of one or more of the ADC modules 306.1 through 306.n.

The sampling module 702 samples the analog input 750 in accordance a sampling clock 754 to provide a sampled analog input 760. The sampling clock 754 can represent an exemplary embodiment of one of the multiple phases 154.1 through 154.n of the sampling clock of the multi-lane ADC 300. The sampling module 702 includes a voltage control delay module 706 and a sampling module 708. The voltage control delay module 706 advances and/or retreats a phase of the sampling clock 754 in response to a phase adjustment signal 756 to provide a phase adjusted sampling clock 758. The phase adjustment signal 756 can represent an exemplary embodiment of a phase adjustment signal from one of the phase and/or bandwidth adjustment signals 358.1 through 358.n.

The sampling module 708 samples the analog input 750 in accordance with the phase adjusted sampling clock 758 to provide the sampled analog input 760. The phase adjusted sampling clock 758 activates the sampling module 708 when at a first logical value, such as a logical one to provide an example, or deactivates the sampling module 708 when at a second logical value, such as a logical zero to provide an example. The sampling module 708 samples the analog input 750 to provide the sampled analog input 760 when activated and does not sample the analog input 750 when deactivated. In an exemplary embodiment, the sampling module 708 includes a sampling capacitor $C_1$ and a sampling switch $SW_1$. In this exemplary embodiment, the phase adjusted sampling clock 758 opens the sampling switch $SW_1$ to charge the sampling capacitor $C_1$ with the analog input 750 when at the first logical value and closes the sampling switch $SW_1$ to discharge the sampling capacitor $C_1$ when at the second logical value to sample the analog input 750.

The ADC 704 converts the sampled analog input from the analog signal domain to the digital signal domain to provide the digital sample 752.

Figure 7B:
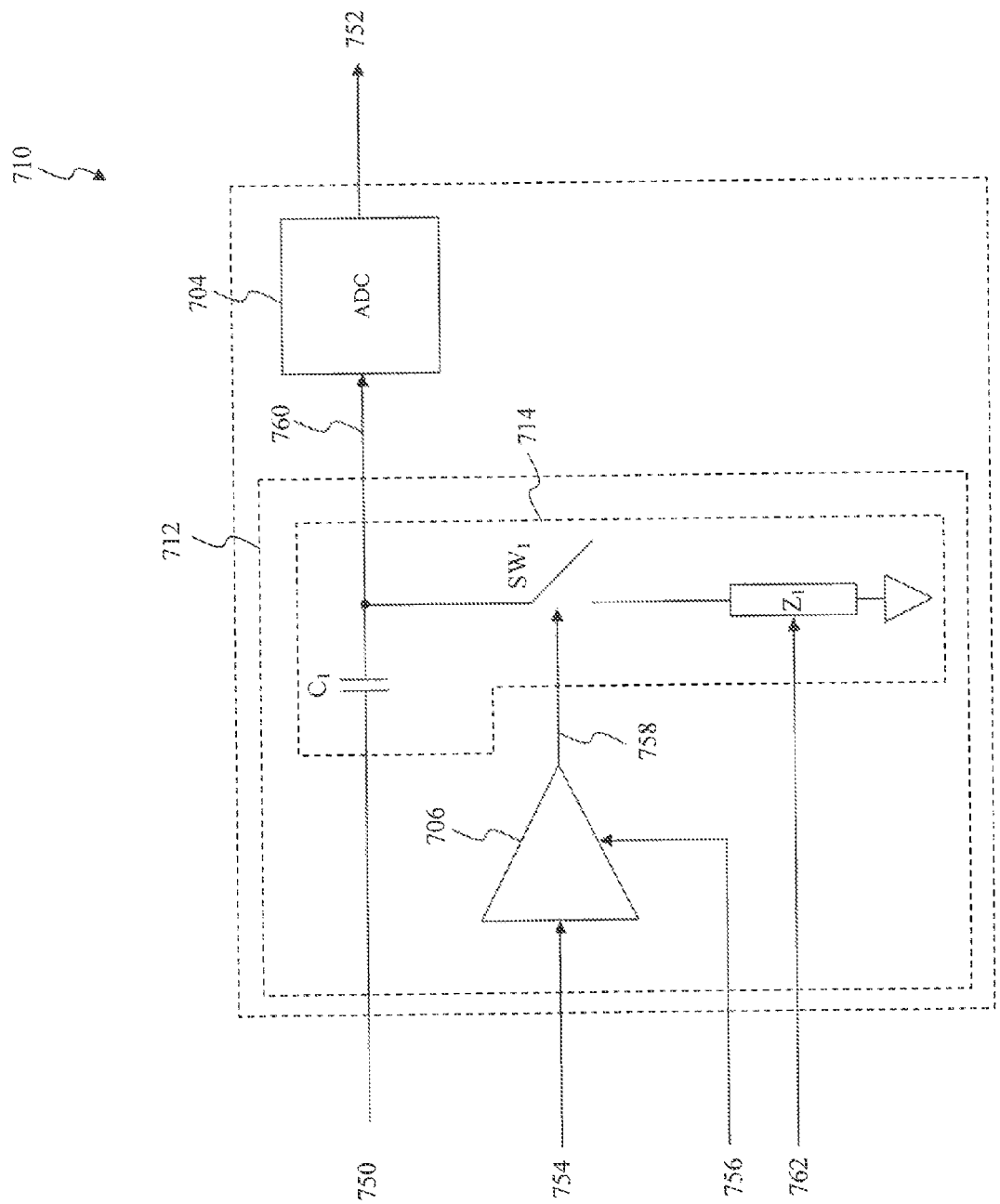
FIG. 7B illustrates a block diagram of a second ADC module that can be implemented within the first exemplary multi-lane ADC according to an exemplary embodiment of the present disclosure.

FIG. 7B illustrates a block diagram of a second ADC module that can be implemented within the first exemplary multi-lane ADC according to an exemplary embodiment of the present disclosure. An ADC module 710 converts the analog input 750 from the analog signal domain to the digital signal domain to provide the digital sample 752. The ADC module 710 samples the analog input 750, and converts these samples from the analog signal domain to the digital signal domain to provide the digital sample 752. The ADC module 710 includes the ADC 704 and a sampling module 712. The ADC module 710 can represent an exemplary embodiment of one or more of the ADC modules 306.1 through 306.n. The ADC module 710 operates in a substantially similar manner as the ADC module 700; therefore, only differences between the ADC module 700 and the ADC module 710 are to be discussed in further detail.

The sampling module 712 samples the analog input 750 in accordance the sampling clock 754 to provide the sampled analog input 760. The sampling module 702 includes the voltage control delay module 706 and a sampling module 714. The sampling module 714 samples the analog input 750 in accordance with the phase adjusted sampling clock 758 to provide the sampled analog input 760 in a substantially similar manner as the sampling module 708. However, the sampling module 714 additionally includes a variable impedance $Z_1$.

The variable impedance $Z_1$ increases and/or decreases a frequency response, or bandwidth, of the sampling module 712 in response to a frequency adjustment signal 762. The frequency adjustment signal 762 can represent an exemplary embodiment of a frequency adjustment signal from one of the phase and/or bandwidth adjustment signals 358.1 through 358.n. Typically, the bandwidth of the sampling module 712 is related to a time constant of the sampling capacitor $C_1$ and the variable impedance $Z_1$. The bandwidth of the sampling module 712 can be increased by decreasing the variable impedance $Z_1$ and/or can be decreased by increasing the variable impedance $Z_1$.

Figure 7C:
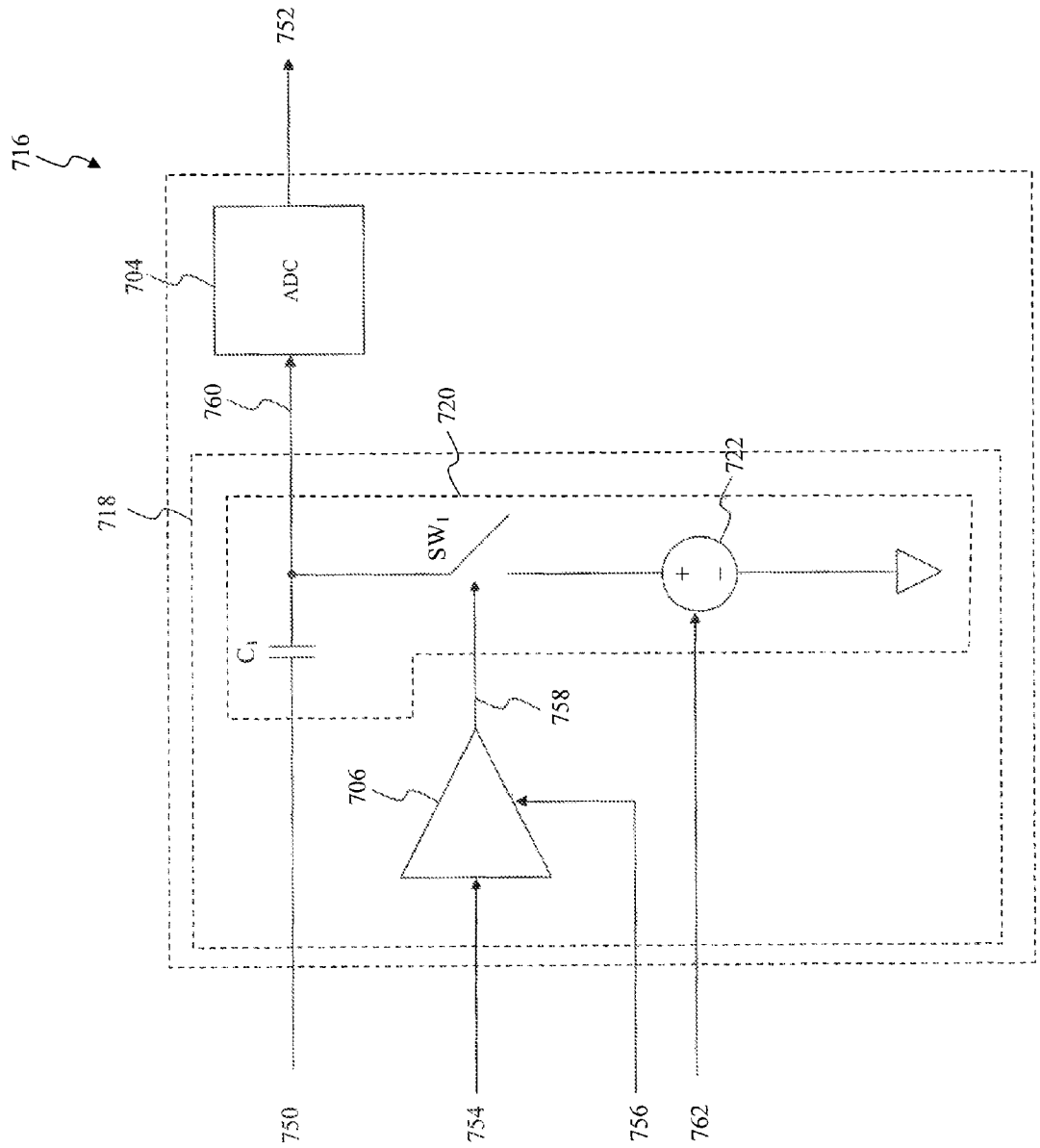
FIG. 7C illustrates a block diagram of a second ADC module that can be implemented within the first exemplary multi-lane ADC according to an exemplary embodiment of the present disclosure.

FIG. 7C illustrates a block diagram of a third ADC module that can be implemented within the first exemplary multi-lane ADC according to an exemplary embodiment of the present disclosure. An ADC module 716 converts the analog input 750 from the analog signal domain to the digital signal domain to provide the digital sample 752. The ADC module 716 samples the analog input 750, and converts these samples from the analog signal domain to the digital signal domain to provide the digital sample 752. The ADC module 716 includes the ADC 704 and a sampling module 718. The ADC module 716 can represent an exemplary embodiment of one or more of the ADC modules 306.1 through 306.n. The ADC module 716 operates in a substantially similar manner as the ADC module 700; therefore, only differences between the ADC module 700 and the ADC module 710 are to be discussed in further detail.

The sampling module 718 samples the analog input 750 in accordance the sampling clock 754 to provide the sampled analog input 760. The sampling module 702 includes the voltage control delay module 706 and a sampling module 720. The sampling module 720 samples the analog input 750 in accordance with the phase adjusted sampling clock 758 to provide the sampled analog input 760 in a substantially similar manner as the sampling module 708. However, the sampling module 714 additionally includes a variable voltage source 722.

The bandwidth of the sampling module 718 can be increased by decreasing an "ON" resistance of the sampling switch $SW_1$ and/or can be decreased by increasing the "ON" resistance of the sampling switch $SW_1$. The frequency adjustment signal 762 can be used to increase and/or decrease the "ON" resistance of the sampling switch $SW_1$ by increasing and/or decreasing a gate to source voltage of the sampling switch $SW_1$ when it is operated in its linear region. As shown in FIG. 7C, the gate to source voltage of the sampling switch $SW_1$ is approximately equal to a difference between the first logical value of the phase adjusted sampling clock 758 applied to a gate of the sampling switch $SW_1$ to activate the sampling switch $SW_1$ and a voltage applied by the variable voltage source 722 to the source of the sampling switch $SW_1$ when activated.

Figure 8:
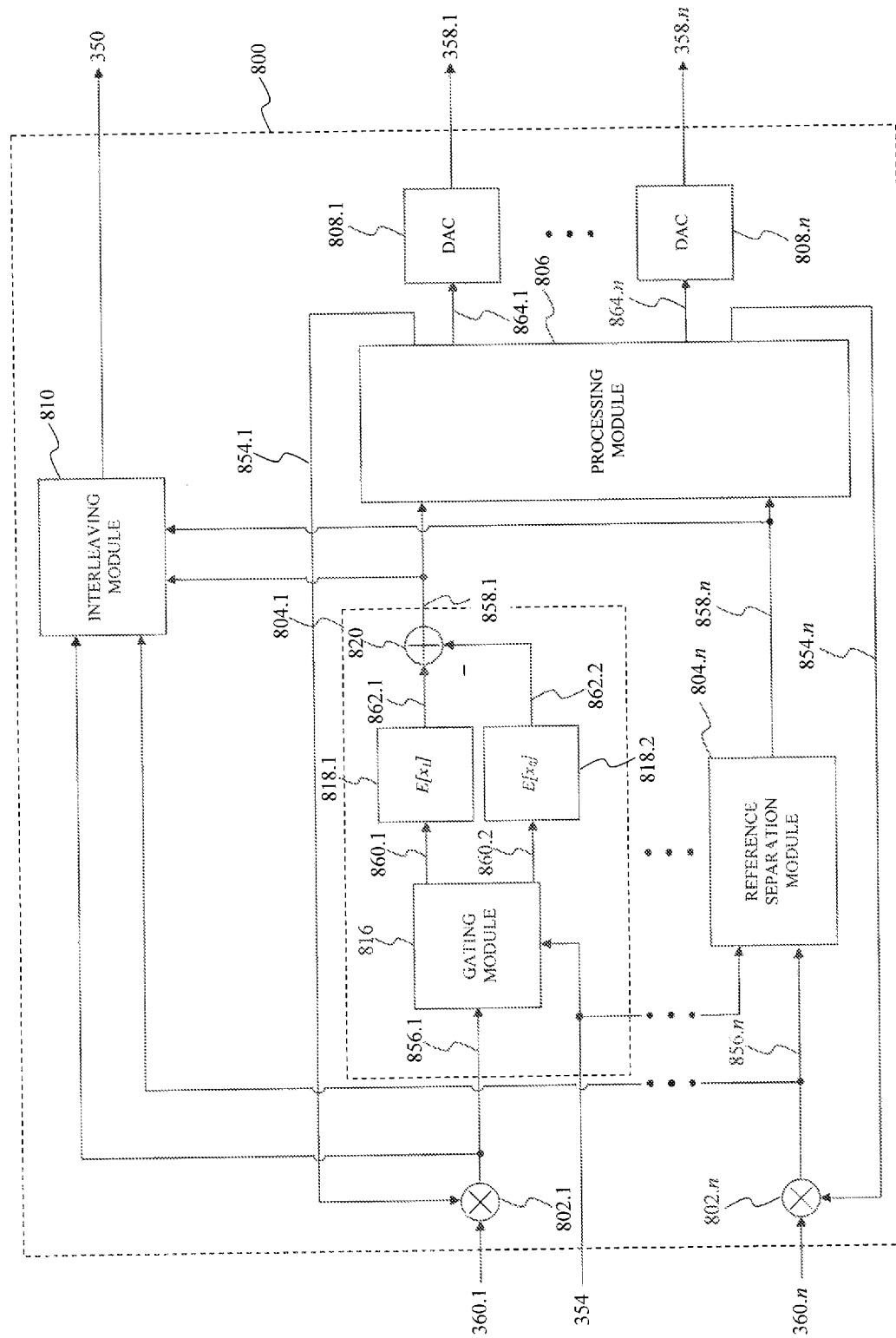
FIG. 8 illustrates a block diagram of a compensation module that can be implemented within the first exemplary multi-lane ADC according to an exemplary embodiment of the present disclosure.

Exemplary Compensation Module that can be Implemented within in the First Exemplary Multi-Lane ADC FIG. 8 illustrates a block diagram of a compensation module that can be implemented within the first exemplary multi-lane ADC according to an exemplary embodiment of the present disclosure. A compensation module 800 estimates unwanted phase offsets between multiple phases of a sampling clock of a multi-lane ADC to provide phase adjustment signals in the phase offset compensation mode of operation. Additionally, the compensation module 800 estimates unwanted gain mismatches between ADC modules and adjusts gains of the one or more ADC modules in the gain compensation mode of operation. Further, the compensation module 800 estimates the unwanted bandwidth mismatches between the ADC modules and bandwidths of the one or more ADC modules in the bandwidth compensation mode of operation. Yet further, the compensation module can interleave or re-combine the digital output samples and remove a digital representation of a reference signal used in the phase offset, bandwidth, and gain compensation modes of operation from the digital output samples to provide the digital output 350. The compensation module 800 includes digital multipliers 802.1 through 802.n, reference separation modules 804.1 through 804.n, a processing module 806, digital-to-analog converters (DACs) 808.1 through 808.n, and an interleaving module 810. The compensation module 800 can represent an exemplary embodiment of the compensation module 308.

The digital multipliers 802.1 through 802.n adjust amplitudes of digital samples 360.1 through 360.n in response to digital gain adjustment signals 854.1 through 854.n to compensate for the unwanted gain mismatches between the ADC modules. Specifically, the digital multipliers 802.1 through 802.n multiply the digital samples 360.1 through 360.n and the digital gain adjustment signals 854.1 through 854.n in the digital signal domain to provide gain adjusted digital samples 856.1 through 856.n.

The reference separation modules 804.1 through 804.n separates a digital representation of an uncorrelated reference signal that is embedded within each of the gain adjusted digital samples 856.1 through 856.n to provide digital uncorrelated reference signals 858.1 through 858.n. The reference separation modules 804.1 through 804.n are implemented in substantially similar manners; therefore only the reference separation module 804.1 is discussed in further detail.

The reference separation module 804.1 separates a digital representation of an uncorrelated reference signal that is embedded within the gain adjusted digital samples 856.1 to provide the digital uncorrelated reference signal 858.1. The reference separation module 804.1 includes a gating module 816, expected value modules 818.1 and 818.2, and a summation module 820. The gating module 816 provides the gain adjusted digital sample 856.1 as a first gain adjusted digital sample 860.1 when the pseudo-random correlation signal 354 is at a first level, such as a logical one to provide an example, or as a second gain adjusted digital sample 860.2 when the pseudo-random correlation signal 354 is at a second level, such as a logical zero to provide an example.

The expected value modules 818.1 and 818.2 determine expected values of the first gain adjusted digital sample 860.1 to provide a first expected value 862.1 and the second gain adjusted digital sample 860.2 to provide a second expected value 862.2, respectively. The first expected value 862.1 and the second expected value 862.2 represent weighted averages of all possible values of the first gain adjusted digital sample 860.1 and the second gain adjusted digital sample 860.2. The expected value $E[X_1]$ of the first gain adjusted digital sample 860.1 can be calculated as:

$$E[X_1] = \frac{x_1 p_1 + x_2 p_2 + \ldots + x_k p_k}{p_1 + p_2 + \ldots + p_k}, \tag{3}$$

and the expected value $E[X_0]$ of the second gain adjusted digital sample 860.2 can be calculated as:

$$E[X_0] = \frac{x_1 p_1 + x_2 p_2 + \ldots + x_k p_k}{p_1 + p_2 + \ldots + p_k}, \tag{4}$$

where $E[X]$ represents the expected value of the first gain adjusted digital sample 860.1 or the second gain adjusted digital sample 860.2, $x_1$ through $x_k$ represents a value of the first gain adjusted digital sample 860.1 or a value of the second gain adjusted digital sample 860.2, and $p_1$ through $p_k$ represents a probability of the value of the first gain adjusted digital sample 860.1 or of the value of the second gain adjusted digital sample 860.2. Typically, the probabilities $p_1$ through $p_k$ are equally probable, therefore, the expected value E[X] of the first gain adjusted digital sample 860.1 represents a simple average of the first gain adjusted digital sample 860.1 and the expected value E[X] of the second gain adjusted digital sample 860.2 represents a simple average of the second gain adjusted digital sample 860.2.

The summation module 820 subtracts the second gain adjusted digital sample 860.2 from the first gain adjusted digital sample 860.1 to provide the digital uncorrelated reference signal 858.1. Typically, the expected value $E[X_1]$ of the digital representation of an analog input embedded within the gain adjusted digital sample 856.1 when the pseudo-random correlation signal 354 is at the first level is approximately equal to the expected value $E[X_0]$ of the digital representation of the analog input embedded within the gain adjusted digital sample 856.1 when the pseudo-random correlation signal 354 is at the second level. As a result, subtracting the second gain adjusted digital sample 860.2 from the first gain adjusted digital sample 860.1 removes the analog input embedded within the gain adjusted digital sample 856.1 leaving the digital representation of the uncorrelated reference signal embedded within the gain adjusted digital sample 856.1 as the digital uncorrelated reference signal 858.1.

The processing module 806 provides digital phase and/or bandwidth adjustment signals 864.1 through 864.n in the phase offset and/or bandwidth compensation modes of operation and/or the digital gain adjustment signals 854.1 through 854.n when operating in the gain compensation mode of operation based upon the digital uncorrelated reference signals 858.1 through 858.n. The digital phase and/or bandwidth adjustment signals 864.1 through 864.n can include phase adjustment components for adjusting phases of the multiple phases of the sampling clock and/or bandwidth adjustment components for adjusting frequency responses, or bandwidths, of the ADC modules. The phase adjustment components and the bandwidth adjustment components can represent separate signals or can be multiplexed into combined signals.

Specifically, the processing module 806 compares amplitudes of the digital uncorrelated reference signals 858.1 through 858.n in the phase offset compensation mode of operation to determine an indication of the unwanted phase offset. Ideally, the amplitudes of the digital uncorrelated reference signals 858.1 through 858.n should be substantially similar to each other indicating that the multiple phases of the sampling clock coincide with the sampling moments of the ADC modules. However, unwanted phase offsets between the multiple phases of the sampling clock cause the multiple phases of the sampling clock to lead and/or lag the sampling moments of the ADC modules. As a result, some of the uncorrelated reference signals 858.1 through 858.n can differ in amplitude from other uncorrelated reference signals 858.1 through 858.n. In this situation, the processing module 806 provides phase adjustment components of the digital phase and/or bandwidth adjustment signals 864.1 through 864.n to cause the ADC modules, whose uncorrelated reference signals 858.1 through 858.n differ, to advance and/or retreat phases of their corresponding multiple phases of the sampling clock to cause the amplitudes of the digital uncorrelated reference signals 858.1 through 858.n to approach substantial similarity.

Additionally, the processing module 806 compares amplitudes of the digital uncorrelated reference signals 858.1 through 858.n in the gain compensation mode of operation to determine an indication of the unwanted gain mismatch. Ideally, the digital uncorrelated reference signals 858.1 through 858.n should be substantially similar to each other indicating no substantial unwanted gain mismatches between the ADC modules. However, unwanted gain mismatches between the ADC modules can cause some of the uncorrelated reference signals 858.1 through 858.n to differ in amplitude from other uncorrelated reference signals 858.1 through 858.n. In this situation, the processing module 806 provides the digital gain adjustment signals 854.1 through 854.n to adjust the digital samples 360.1 through 360.n to cause the amplitudes of the digital uncorrelated reference signals 858.1 through 858.n to approach substantial similarity.

Further, the processing module 806 compares amplitudes of the digital uncorrelated reference signals 858.1 through 858.n in the bandwidth compensation mode of operation to determine an indication of the unwanted bandwidth mismatch. Ideally, the digital uncorrelated reference signals 858.1 through 858.n should be substantially similar to each other indicating no substantial unwanted bandwidth mismatches between the ADC modules. However, unwanted bandwidth mismatches between the ADC modules can cause some of the uncorrelated reference signals 858.1 through 858.n to differ in amplitude from other uncorrelated reference signals 858.1 through 858.n. In this situation, the processing module 806 provides bandwidth adjustment components of the digital phase and/or bandwidth adjustment signals 864.n to cause the ADC modules, whose uncorrelated reference signals 858.1 through 858.n differ, to increase and/or decrease their bandwidths to cause the amplitudes of the digital uncorrelated reference signals 858.1 through 858.n to approach substantial similarity.

The DACs 808.1 through 808.n convert the digital phase and/or bandwidth adjustment signals 864.1 through 864.n from representations in the digital signal domain to representation in the analog signal domain to provide the phase and/or bandwidth adjustment signals 358.1 through 358.n. In some situations, the DACs 808.1 through 808.n are optional. In these situations, the digital phase and/or bandwidth adjustment signals 864.n are provides by the processing module 806 as the phase and/or bandwidth adjustment signals 358.1 through 358.n. In other situations, the digital phase and/or bandwidth adjustment signals 864.1 through 864.n can include the phase adjustment and the bandwidth adjustment signals. In these situations, the DACs 808.1 through 808.n convert can convert either the separate phase adjustment or bandwidth adjustment components from representations in the digital signal domain to representation in the analog signal domain.

The interleaving module 810 interleaves the gain adjusted digital samples 856.1 through 856.n to provide the digital output 350. Additionally, the interleaving module 810 can remove the uncorrelated reference signals 858.1 through 858.n from the gain adjusted digital samples 856.1 through 856.n before and/or after interleaving of the gain adjusted digital samples 856.1 through 856.n.

Second Exemplary Multi-Lane ADC

Generally, dynamic input ranges of the ADC modules are determined such that a maximum value of the analog input is less than or equal to their maximum quantization levels, and/or a minimum value of the analog input is greater than or equal to their minimum quantization levels. However, in some situations, when the uncorrelated reference signal is superimposed onto the analog input, this superimposition can cause the reference superimposed analog input to rise above the maximum quantization levels of the ADC modules, causing the ADC modules to saturate or clip. As a result, the digital output signal no longer accurately represents the analog input when clipping occurs.

Figure 9:
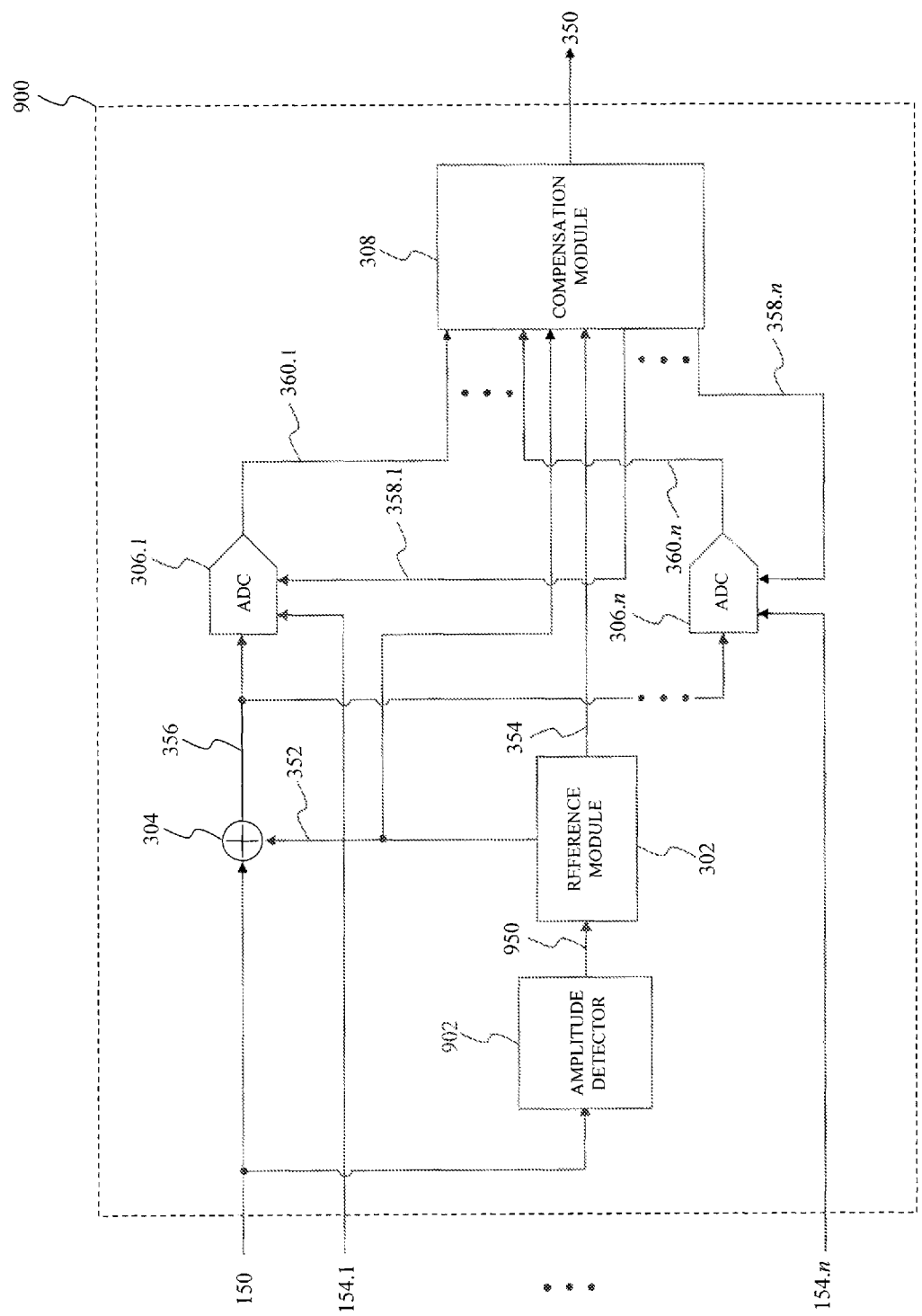
FIG. 9 illustrates a block diagram of a second exemplary multi-lane ADC according to an exemplary embodiment of the present disclosure.

FIG. 9 illustrates a block diagram of a second exemplary multi-lane ADC according to an exemplary embodiment of the present disclosure. A multi-lane ADC 900 converts the analog input 150 from the analog signal domain to the digital signal domain to provide the digital output 350. The multi-lane ADC 900 utilizes the multiple phases of the sampling clock to sample the analog input 150, converts these samples from the analog signal domain to the digital signal domain, and interleaves these digital samples to provide the digital output 350. The multi-lane ADC 900 can operate in the phase offset, gain, and/or bandwidth compensation modes of operation in a substantially similar manner as the multi-lane ADC 300. As a result of the phase offset, gain, and/or bandwidth compensation modes of operation, the digital output 350 more accurately represents the analog input 150 when compared to the digital output 152 of the conventional multi-lane ADC 100. The multi-lane ADC 900 includes the reference module 302, the summation module 304, the ADC modules 306.1 through 306.$n$, the compensation module 308, and an amplitude detector 902. The multi-lane ADC 900 operates in a substantially similar manner as the multi-lane ADC 300; therefore, only differences between the multi-lane ADC 300 and the multi-lane ADC 900 are to be described in further detail.

To reduce clipping that results when the uncorrelated reference signal 352 is superimposed onto the analog input 150, the amplitude detector 902 detects whether an amplitude of the analog input 150 is less than zero, namely a negative value, or greater than or equal to zero, namely a positive value. The amplitude detector 902 provides a first value as an amplitude indicator 950 when the amplitude of the analog input 150 is the negative value and a second value as the amplitude indicator 950 when the amplitude of the analog input 150 is the positive value. Typically, the amplitude detector 902 determines whether the amplitude of the analog input 150 is the negative value or the positive value before the sampling moments of the ADC modules 306.1 through 306.$n$. Alternatively, the amplitude detector 902 detects whether an amplitude of the analog input 150 is near zero, namely a small value, or larger than zero, namely a large value. The amplitude detector 902 provides a first value as an amplitude indicator 950 when the amplitude of the analog input 150 is the small value and a second value as the amplitude indicator 950 when the amplitude of the analog input 150 is the large value. Typically, the amplitude detector 902 determines whether the amplitude of the analog input 150 is the small value or the large value before the sampling moments of the ADC modules 306.1 through 306.$n$.

The reference module 302 negates the uncorrelated reference signal 352, that is, its amplitude is multiplied by −1, when the amplitude indicator 950 is at the second value indicating that the amplitude of the analog input 150 is the positive value. In this situation, the superimposition of the uncorrelated reference signal 352 onto the analog input 150 prevents the reference superimposed analog input 356 from rising above the maximum quantization levels of the ADC modules 306.1 through 306.$n$. Otherwise, the reference module 302 does not negate the uncorrelated reference signal 352 when the amplitude indicator 950 is at the first value indicating that the amplitude of the analog input 150 is the negative value.

Figure 10:
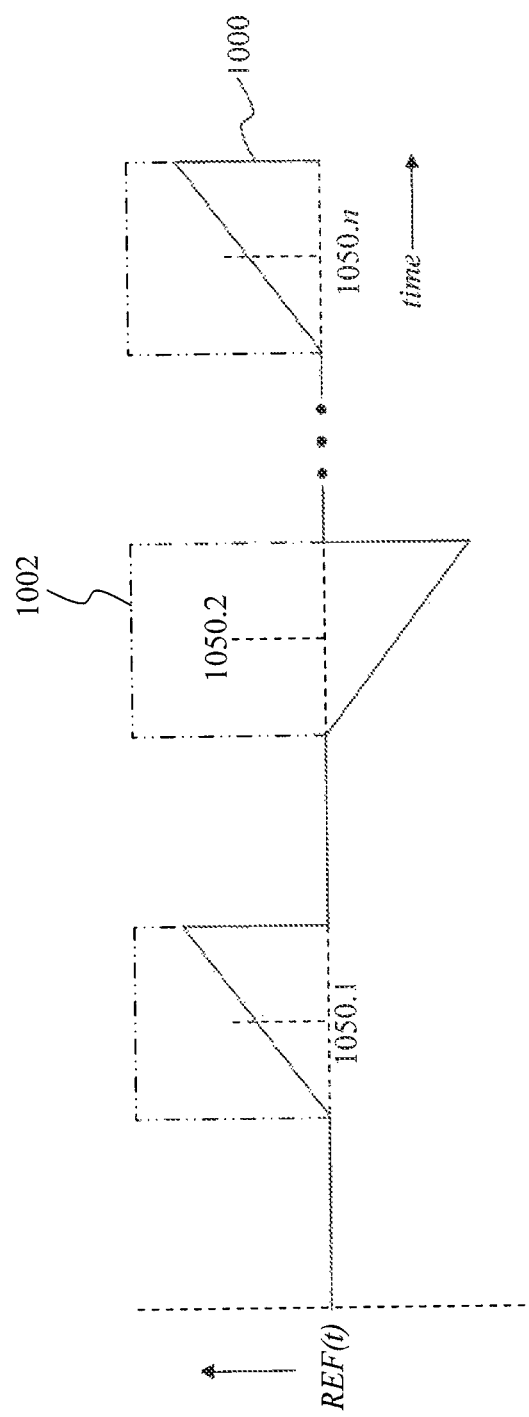
FIG. 10 illustrates a time-domain representation of a first exemplary phase offset compensation reference signal that can be used within the second exemplary multi-lane ADC according to an exemplary embodiment of the present disclosure.

FIG. 10 illustrates a time-domain representation of a first exemplary phase offset compensation reference signal that can be used within the second exemplary multi-lane ADC according to an exemplary embodiment of the present disclosure. A multi-lane ADC can utilize a phase offset compensation reference signal 1000 to estimate unwanted phase offsets between multiple phases of a sampling clock 1002 of the multi-lane ADC. The phase offset compensation reference signal 1000 can represent an exemplary embodiment of the reference signal 352.

As shown in FIG. 10, the phase offset compensation reference signal 1000 can be characterized as being a periodic ramping signal that is periodic with the sampling clock 1002. However, this is for illustrative purposes only, those skilled in the relevant art(s) will recognize that the phase offset compensation reference signal 1000 can be implemented using any other non-linear function or any linear increasing function being non-substantially constant amplitude around sampling moments of ADC modules, such as the ADC modules 306.1 through 306.$n$, of the multi-lane ADC without departing from the spirit and scope of the present disclosure. The periodic ramping signal can be characterized as being a combination of a non-negated ramping signal and a negated ramping signal. For example, the periodic ramping signal represents the non-negated ramping signal around sampling moments 1050.1 and 1050.$n$ of ADC modules of the multi-lane ADC. In this example, the analog input is less than zero, namely a negative value, around the around sampling moments 1050.1 and 1050.$n$. As another example, the periodic ramping signal represents the negated ramping signal around sampling moment 1050.2 of the ADC modules of the multi-lane ADC. In this other example, the analog input is greater than or equal to zero, around the around sampling moment 1050.2.

Although FIG. 10 has been described in terms of the phase offset compensation mode of operation, this is for illustrative purposes only. Those skilled in the relevant art(s) will recognize that a substantially similar manner can be used in the gain and/or bandwidth compensation modes of operation to reduce clipping without departing from the spirit and scope of the present disclosure.

Exemplary Method of Operation of the First or the Second Exemplary Multi-Lane ADCS The phase offset, gain, and/or bandwidth compensation modes of operation represent compensation modes of operation that are performed in the background while the multi-lane ADC is converting the analog input from the analog signal domain to the digital signal domain.

FIG. 11 is a flowchart of exemplary operational steps of the first exemplary multi-lane ADC or the second exemplary multi-lane ADC according to an exemplary embodiment of the present disclosure. The disclosure is not limited to this operational description. Rather, it will be apparent to persons skilled in the relevant art(s) from the teachings herein that other operational control flows are within the scope and spirit of the present disclosure. The following discussion describes the steps in FIG. 11.

At step 1100, the operational control flow starts. The phase offset, gain, and/or bandwidth compensation modes of operation are to be discussed below in steps 1102 through 1106. However, those skilled in the relevant art(s) will recognize that the phase offset, gain, and/or bandwidth compensation modes of operation can be performed in a different order than as shown in FIG. 11 without departing from the spirit and scope of the present disclosure. Additionally, those skilled in the relevant art(s) will recognize that not all of phase offset, gain, and/or bandwidth compensation modes of operation need to be performed as shown in FIG. 11 without departing from the spirit and scope of the present disclosure.

At step 1102, the operational control flow operates in a gain compensation mode of operation. In the gain compensation mode of operation, the operational control flow compensates for unwanted gain mismatches between lanes in a multi-lane ADC. Specifically, the operational control flow superimposes a first uncorrelated reference signal onto an analog input. The first uncorrelated reference signal is substantially constant amplitude around sampling moments of ADC modules from among the multi-lane ADC. The ADC modules sample the first uncorrelated reference signal and the analog input in accordance with multiple phases of a sampling clock. The ADC modules convert these samples from the analog signal domain to the digital signal domain to provide digital samples of the first uncorrelated reference signal superimposed onto digital samples of the analog input. The operational control flow continuously compares amplitudes of the digital samples of the first uncorrelated reference signal from each of the ADC modules and adjusts amplitudes of outputs of the ADC modules until the amplitudes of the digital uncorrelated reference signals approach substantial similarity. The operational control flow proceeds to step 1104 once the amplitudes of the digital uncorrelated reference signals approach substantial similarity.

At step 1104, the operational control flow operates in an offset compensation mode of operation. In the offset compensation mode of operation, the operational control flow compensates for unwanted phase offsets between multiple phases of a sampling clock. Specifically, the operational control flow superimposes a second uncorrelated reference signal onto the analog input. The second uncorrelated reference signal is non-substantially constant amplitude around the sampling moments of the ADC modules. The ADC modules sample the second uncorrelated reference signal and the analog input in accordance with the multiple phases of the sampling clock. The ADC modules convert these samples from the analog signal domain to the digital signal domain to provide digital samples of the second uncorrelated reference signal superimposed onto digital samples of the analog input. The operational control flow continuously compares amplitudes of the digital samples of the second uncorrelated reference signal from each of the ADC modules and adjusts phases of the multiple phases of the sampling clock until the amplitudes of the digital uncorrelated reference signals approach substantial similarity. The operational control flow proceeds to step 1106 once the amplitudes of the digital uncorrelated reference signals approach substantial similarity.

At step 1106, the operational control flow operates in a bandwidth compensation mode of operation. In the bandwidth compensation mode of operation, the operational control flow compensates for unwanted bandwidth mismatches between lanes in the multi-lane ADC. Specifically, the operational control flow superimposes a third uncorrelated reference signal onto an analog input. The third uncorrelated reference signal is sinusoidal signal with a substantially constant frequency, or can vary in frequency. The ADC modules sample the first uncorrelated reference signal and the analog input in accordance with the multiple phases of the sampling clock. The ADC modules convert these samples from the analog signal domain to the digital signal domain to provide digital samples of the third uncorrelated reference signal superimposed onto digital samples of the analog input. The operational control flow continuously compares amplitudes of the digital samples of the first uncorrelated reference signal from each of the ADC modules and adjusts bandwidths of the ADC modules until the amplitudes of the digital uncorrelated reference signals approach substantial similarity. The operational control flow proceeds to step 1104 once the amplitudes of the digital uncorrelated reference signals approach substantial similarity. The operation control flow can revert back to step 1102, revert to back to step 1104, or repeat step 1106 once the amplitudes of the digital uncorrelated reference signals approach substantial similarity.

At step 1108, the operational control flow converts the analog input from the analog signal domain to the digital signal domain to provide a digital output. Specifically, the operational control flow removes the digital samples of the analog input from the digital samples of the first uncorrelated reference signal superimposed onto digital samples of the analog input from step 1102 or the digital samples of the second uncorrelated reference signal superimposed onto digital samples of the analog input from step 1102. The operational control flow interleaves the digital samples of the analog input to provide the digital output that accurately represents the analog input.

At step 1110, the operation control flow ends.

CONCLUSION

It is to be appreciated that the Detailed Description section, and not the Abstract section, is intended to be used to interpret the claims. The Abstract section may set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus the present disclosure should not be limited by any of the above-described exemplary embodiments, but should be defined only in accordance with the following claims and their equivalents.

What is claimed is:

1. A multi-lane analog-to-digital converter (ADC) for converting an analog input from an analog signal domain to a digital signal domain to provide a digital output, the multi-lane ADC comprising:
   a reference module configured to provide a reference signal that is substantially uncorrelated with the analog input;
   a summation module configured to superimpose the reference signal onto the analog input to provide a superimposed analog input;
   a first ADC module configured to convert the superimposed analog input in accordance with a first phase of a sampling clock to provide a first superimposed digital sample, the first superimposed digital sample including a first digital representation of the reference signal and a first digital representation of the analog input;
   a second ADC module configured to convert the superimposed analog input in accordance with a second phase of a sampling clock to provide a second superimposed digital sample, the second superimposed digital sample including a second digital representation of the reference signal and a second digital representation of the analog input; and a compensation module configured to compare the first and the second digital representations of the reference signal to estimate an unwanted phase offset between the first and the second phases of the sampling clock, to adjust phases of the first phase and the second phase to compensate for the unwanted phase offset, and to interleave the first and the second digital representations of the analog input to provide the digital output.

2. The multi-lane ADC of claim 1, wherein the reference signal is characterized as being a product of a pseudo-random binary sequence and a second reference signal, the second reference signal having a non-substantially constant amplitude around sampling moments of the first and the second ADC modules.

3. The multi-lane ADC of claim 2, wherein the second reference signal is further characterized as being a ramping signal that is periodic around the sampling moments.

4. The multi-lane ADC of claim 1, wherein the compensation module comprises:
  a first and a second reference separation module configured to separate the first and the second digital representations of the reference signal from the first and the second superimposed digital samples, respectively; and
  a processing module configured to compare amplitudes of the first and the second digital representations of the reference signal and to provide a first digital phase adjustment signal to the first ADC module and a second digital phase adjustment signal to the second ADC module that cause the amplitudes of the first and the second digital representations of the reference signal to approach substantial similarity.

5. The multi-lane ADC of claim 4, wherein the first reference separation module comprises:
  a gating module configured to provide the first superimposed digital sample as a first digital sample when a pseudo-random signal is at a first level or as a second digital sample when the pseudo-random signal is at a second level, the pseudo-random signal being correlated with the reference signal;
  a first and a second expected value module configured to determine a first expected value of the first digital sample and a second expected value of the second digital sample, respectively; and
  a summation module configured to subtract the second expected value from the first expected value to provide the first digital representation of the reference signal.

6. The multi-lane ADC of claim 4, wherein the compensation module further comprises:
  an interleaving module configured to remove the first digital representation of the reference signal from the first superimposed digital sample and the second digital representation of the reference signal from the second superimposed digital sample and to interleave the first and the second digital representations of the analog input to provide the digital output.

7. A multi-lane analog-to-digital converter (ADC) for converting an analog input from an analog signal domain to a digital signal domain to provide a digital output, the multi-lane ADC comprising:
  a reference module configured to provide a reference signal that is substantially uncorrelated with the analog input;
  a summation module configured to superimpose the reference signal onto the analog input to provide a superimposed analog input;
  a first ADC module configured to convert the superimposed analog input to provide a first superimposed digital sample, the first superimposed digital sample including a first digital representation of the reference signal and a first digital representation of the analog input;
  a second ADC module configured to convert the superimposed analog input to provide a second superimposed digital sample, the second superimposed digital sample including a second digital representation of the reference signal and a second digital representation of the analog input; and
  a compensation module configured to compare the first and the second digital representations of the reference signal to estimate an unwanted gain mismatch between the first and the second ADC modules, to adjust amplitudes of the first and the second superimposed digital samples to compensate for the unwanted gain mismatch, and to interleave the first and the second digital representations of the analog input to provide the digital output.

8. The multi-lane ADC of claim 7, wherein the first and the second ADC modules are configured to convert the superimposed analog input in accordance with a first phase and a second phase, respectively, of a sampling clock.

9. The multi-lane ADC of claim 7, wherein the reference signal is characterized as being a product of a pseudo-random binary sequence and a second reference signal, the second reference signal having a substantially constant amplitude around sampling moments of the first and the second ADC modules.

10. The multi-lane ADC of claim 7, wherein the compensation module comprises:
  a first and a second digital multiplier configured to multiply the first and the second superimposed digital samples and a first digital gain adjustment signal to provide a first gain adjusted digital sample and a second digital gain adjustment signal to provide a second gain adjusted digital sample, respectively;
  a first and a second reference separation module configured to separate the first and the second digital representations of the reference signal from the first and the second superimposed digital samples, respectively; and
  a processing module configured to compare amplitudes of the first and the second digital representations of the reference signal and to provide the first and the second digital gain adjustment signals that cause the amplitudes of the first and the second digital representations of the reference signal to approach substantial similarity.

11. The multi-lane ADC of claim 10, wherein the first reference separation module comprises:
  a gating module configured to provide the first superimposed digital sample as a first digital sample when a pseudo-random signal is at a first level or as a second digital sample when the pseudo-random signal is at a second level, the pseudo-random signal being correlated with the reference signal;
  a first and a second expected value module configured to determine a first expected value of the first digital sample and a second expected value of the second digital sample, respectively; and
  a summation module configured to subtract the second expected value from the first expected value to provide the first digital representation of the reference signal.

12. The multi-lane ADC of claim 10, wherein the compensation module further comprises:
  an interleaving module configured to remove the first digital representation of the reference signal from the first superimposed digital sample and the second digital representation of the reference signal from the second superimposed digital sample and to interleave the first and the second digital representations of the analog input to provide the digital output.

13. A multi-lane analog-to-digital converter (ADC) for converting an analog input from an analog signal domain to a digital signal domain to provide a digital output, the multi-lane ADC comprising:
    a reference module configured to provide a reference signal that is substantially uncorrelated with the analog input;
    a summation module configured to superimpose the reference signal onto the analog input to provide a superimposed analog input;
    a first and a second ADC module configured to convert the superimposed analog input in accordance with a first phase of a sampling clock to provide a first superimposed digital sample and a second phase of the sampling clock to provide a second superimposed digital sample, respectively; and
    a compensation module configured to compare amplitudes of a first digital representation of the reference signal embedded with a first superimposed digital sample and a second digital representation of the reference signal embedded with a second superimposed digital sample and to adjust an operational parameter of the multi-lane ADC to cause the amplitudes of the first and the second digital representations of the reference signal to approach substantial similarity to compensate for an impairment within the multi-lane ADC.

14. The multi-lane ADC of claim 13, wherein the impairment comprises:
    unwanted phase offsets between the first and the second phases of the sampling clock;
    unwanted bandwidth mismatches between the first and the second ADC modules, or
    unwanted gain mismatches between the first and the second ADC modules.

15. The multi-lane ADC of claim 13, wherein the operational parameter comprises:
    a phase of the first phase of the sampling clock;
    a phase of the second phase of the sampling clock;
    an amplitude of the first superimposed digital sample;
    an amplitude of the second superimposed digital sample;
    a bandwidth of the first ADC module, or
    a bandwidth of the second ADC module.

16. The multi-lane ADC of claim 13, wherein the reference signal is characterized as being a product of a pseudo-random binary sequence and a second reference signal, the second reference signal having a non-substantially constant amplitude around sampling moments of the first and the second ADC modules.

17. The multi-lane ADC of claim 13, wherein the reference signal is characterized as being a product of a pseudo-random binary sequence and a second reference signal, the second reference signal having a substantially constant amplitude around sampling moments of the first and the second ADC modules.

18. The multi-lane ADC of claim 13, wherein the reference signal is characterized as being a product of a pseudo-random binary sequence and a sinusoidal signal.

19. The multi-lane ADC of claim 13, wherein the compensation module is further configured to remove the first digital representation of the reference signal from the first superimposed digital sample and the second digital representation of the reference signal from the second superimposed digital sample and to interleave first and second digital representations of the analog input to provide the digital output.

20. The multi-lane ADC of claim 13, wherein the compensation module comprises:
    a first and a second reference separation module configured to separate the first and the second digital representations of the reference signal from the first and the second superimposed digital samples, respectively; and
    a processing module configured to compare the amplitudes of the first and the second digital representations of the reference signal and to provide one or more adjustment signals that cause the amplitudes of the first and the second digital representations of the reference signal to approach substantial similarity.

* * * * *